United States Patent
Chae et al.

(10) Patent No.: US 10,650,871 B2
(45) Date of Patent: May 12, 2020

(54) READ MARGIN CONTROL CIRCUIT DETERMINING DATA VALID WINDOW, MEMORY CONTROLLER INCLUDING THE SAME, AND ELECTRONIC DEVICE

(71) Applicant: SAMSUNG ELECTRONICS CO., LTD., Suwon-si (KR)

(72) Inventors: Kwanyeob Chae, Seoul (KR); Sanghune Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/118,863

(22) Filed: Aug. 31, 2018

(65) Prior Publication Data

US 2019/0214062 A1 Jul. 11, 2019

(30) Foreign Application Priority Data

Jan. 10, 2018 (KR) ........................ 10-2018-0003172

(51) Int. Cl.
| | |
|---|---|
| *G11C 7/22* | (2006.01) |
| *G06F 13/16* | (2006.01) |
| *H03K 19/20* | (2006.01) |
| *H03K 19/21* | (2006.01) |

(52) U.S. Cl.
CPC .......... *G11C 7/222* (2013.01); *G06F 13/1689* (2013.01); *H03K 19/20* (2013.01); *H03K 19/21* (2013.01)

(58) Field of Classification Search
CPC ..... G11C 7/222; G06F 13/1689; H03K 19/20; H03K 19/21
See application file for complete search history.

(56) References Cited

U.S. PATENT DOCUMENTS

| | | | |
|---|---|---|---|
| 6,434,081 B1 | 8/2002 | Johnson et al. | |
| 6,715,096 B2 | 3/2004 | Kuge | |
| 7,123,051 B1 * | 10/2006 | Lee | .................. H03K 19/17744 326/40 |
| 7,304,898 B2 | 12/2007 | Lee et al. | |
| 7,323,903 B1 | 1/2008 | Lee et al. | |
| 7,365,548 B2 | 4/2008 | Neuman | |
| 7,509,223 B2 | 3/2009 | Chong et al. | |
| 7,802,123 B2 | 9/2010 | Chae | |
| 7,886,174 B2 | 2/2011 | Spry et al. | |
| 8,045,663 B2 | 10/2011 | Bae et al. | |
| 8,593,195 B1 | 11/2013 | Huang et al. | |
| 8,897,083 B1 | 11/2014 | Azizi et al. | |
| 9,058,898 B1 * | 6/2015 | Ho | ........................ G11C 7/1066 |
| 2001/0014922 A1 | 8/2001 | Kuge | |
| 2007/0007970 A1 | 1/2007 | Neuman | |

(Continued)

FOREIGN PATENT DOCUMENTS

KR 10-2014-0041207 A 4/2014

*Primary Examiner* — Harry W Byrne
*Assistant Examiner* — Sultana Begum
(74) *Attorney, Agent, or Firm* — Sughrue Mion, PLLC

(57) ABSTRACT

A read margin control circuit is provided. The read margin control circuit includes a delay circuit that delays a data input/output signal and generates delay signals having different phases from each other, a sampler that samples the delay signals based on a data strobe signal to generate sampling values, and a determiner configured to determine a data valid window of the data input/output signal based on the sampling values.

20 Claims, 21 Drawing Sheets

(56) References Cited

U.S. PATENT DOCUMENTS

| | | | |
|---|---|---|---|
| 2007/0201300 A1* | 8/2007 | Chen | G11C 7/1072 |
| | | | 365/233.12 |
| 2007/0282555 A1 | 12/2007 | Chong et al. | |
| 2007/0297250 A1 | 12/2007 | Chae | |
| 2008/0130811 A1 | 6/2008 | Bae et al. | |
| 2008/0245278 A1 | 10/2008 | Larcom et al. | |
| 2009/0006776 A1 | 1/2009 | Spry et al. | |
| 2012/0243351 A1* | 9/2012 | Ota | G06F 13/4234 |
| | | | 365/193 |
| 2017/0060173 A1 | 3/2017 | Golding | |
| 2017/0092344 A1 | 3/2017 | Chae et al. | |
| 2018/0241381 A1* | 8/2018 | Yi | G11C 7/24 |

* cited by examiner

READ MARGIN CONTROL CIRCUIT DETERMINING DATA VALID WINDOW, MEMORY CONTROLLER INCLUDING THE SAME, AND ELECTRONIC DEVICE

CROSS-REFERENCE TO RELATED APPLICATIONS

This U.S. non-provisional application claims priority under 35 U.S.C. § 119 from Korean Patent Application No. 10-2018-0003172 filed on Jan. 10, 2018, in the Korean Intellectual Property Office, the entire contents of which are incorporated by reference herein.

BACKGROUND

Apparatuses, devices, and articles of manufacture consistent with the present disclosure relate to a read margin control circuit, a memory controller including the same, and an electronic device, and more particularly, relate to a read margin control circuit determining a data valid window, a memory controller including the same, and an electronic device.

A memory device may process a command transmitted from a memory controller based on a clock. The memory device may output a data input/output signal and a data strobe signal in response to a read command of the memory controller. After issuing the read command, the memory controller may sample the data input/output signal based on the data strobe signal.

A sampling point may be placed in the center of the data valid window of the data input/output signal through training between the memory controller and the memory device. However, if operating conditions such as voltage and temperature change, the data input/output signal or the data strobe signal output from the memory device may be shifted, and thus, the sampling point may not be placed in the center of the data valid window. The memory controller cannot access the memory device while the sampling point is adjusted. Accordingly, there is a need to shorten a time taken to adjust the sampling point.

SUMMARY

It is an aspect to provide a read margin control circuit to determine a data valid window, a memory controller including the same, and an electronic device.

According to an aspect of an exemplary embodiment, a read margin control circuit may include a delay circuit configured to delay a data input/output signal and generate a plurality of delay signals having different phases from each other; a sampler configured to sample the plurality of delay signals based on a data strobe signal to generate a plurality of sampling values; and a determiner configured to determine a data valid window of the data input/output signal based on the plurality of sampling values.

According to another aspect of an exemplary embodiment, a memory controller may include a delay circuit configured to delay a data input/output signal transmitted from a memory device to generate a first delay signal, a plurality of second delay signals which are less delayed than the first delay signal, and a plurality of third delay signals which are more delayed than the first delay signal; a sampler configured to sample the first delay signal, the plurality of second delay signals, and the plurality of third delay signals at a rising edge of a data strobe signal transmitted from the memory device and to sample the first delay signal, the plurality of second delay signals, and the plurality of third delay signals at a falling edge of the data strobe signal; and a determiner configured to determine a data valid window of the data input/output signal based on a first rising sampling value and a first falling sampling value of the first delay signal, which are respectively sampled at the rising edge and the falling edge.

According to yet another aspect of an exemplary embodiment, an electronic device may include a memory device configured to generate a data input/output signal and a data strobe signal synchronized with the data input/output signal; and a memory controller configured to generate a plurality of delay signals having different phases by delaying the data input/output signal, to generate a plurality of sampling values by sampling the plurality of delay signals based on the data strobe signal, and to determine a data valid window of the data input/output signal based on the plurality of sampling values.

BRIEF DESCRIPTION OF THE FIGURES

The above and other aspects will become apparent by describing in detail exemplary embodiments thereof with reference to the accompanying drawings, in which.

DETAILED DESCRIPTION

Below, exemplary embodiments may be described in detail and clearly to such an extent that one of ordinary skill in the art may easily implement the inventive concept.

Figure 1:
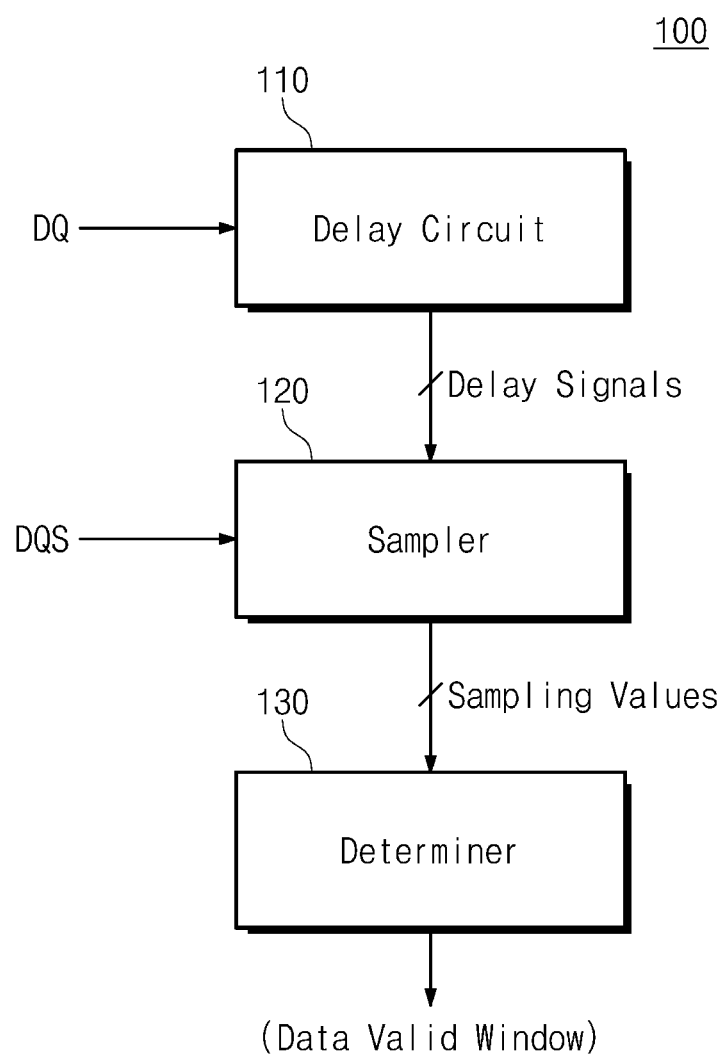
FIG. 1 is a block diagram illustrating a read margin control circuit according to an exemplary embodiment.

FIG. 1 is a block diagram illustrating a read margin control circuit according to an exemplary embodiment. A read margin control circuit 100 may include a delay circuit 110, a sampler 120, and a determiner 130. The read margin control circuit 100 may receive a data input/output signal DQ and a data strobe signal DQS and may determine a data valid window.

The data input/output signal DQ may be generated in response to a read command, by a memory device that receives the read command. Read data may be included in the data input/output signal DQ. The data strobe signal DQS may be generated by the memory device and may be used to sample the data input/output signal DQ. Since the read margin control circuit 100 receives the data input/output signal DQ and the data strobe signal DQS output from the memory device and determines the data valid window, the read margin control circuit 100 may be referred to as a "memory controller".

The data input/output signal DQ may be synchronized with the data strobe signal DQS. The data valid window may indicate a period where the data input/output signal DQ is validly sampled based on the data strobe signal DQS. For example, the data valid window may indicate whether a read margin is sufficient.

The delay circuit 110 may receive the data input/output signal DQ. The delay circuit 110 may delay the data input/output signal DQ and may generate delay signals. For example, phases of the delay signals delayed by the delay circuit 110 may be different from each other. The delay circuit 110 may be referred to as a "delay line".

The sampler 120 may respectively sample the delay signals output from the delay circuit 110 based on the data strobe signal DQS. The sampler 120 may generate sampling values of the delay signals through the sampling. Here, the sampling values may include logical values of the delay signals captured at a rising edge or a falling edge of the data strobe signal DQS. For example, the logical values of the delay signals may be based on data stored in the memory device.

In some exemplary embodiments, the data strobe signal DQS is illustrated as being transmitted in a single-ended manner, but the data strobe signal DQS may be transmitted in a differential manner. That is, the sampler 120 may respectively sample delay signals based on a positive data strobe signal PDQS (not illustrated) and a negative data strobe signal NDQS (not illustrated). Also, the memory device may transmit the data input/output signal DQ at a double data rate, and the data input/output signal DQ may be sampled at both a rising edge and a falling edge of the data strobe signal DQS.

The determiner 130 may determine the data valid window based on the sampling values sampled by the sampler 120. The determiner 130 may determine where a sampling point is placed in the data valid window. A result of the determination of the determiner 130 may be used to adjust the data input/output signal DQ or the data strobe signal DQS such that the sampling point is placed in the center of the data valid window. Here, the sampling point may indicate a point at which an edge of the data strobe signal DQS used to sample the data input/output signal DQ is placed.

In some exemplary embodiments, the determiner 130 may determine the data valid window based on a sampled value of a center delay signal among the delay signals of the delay circuit 110 by the sampler 120. Here, the center delay signal denotes a signal placed at the center when the delay signals are arranged in the order of delay amounts.

In general, before receiving read data that are output from the memory device in response to the read command, training may be performed on the data input/output signal DQ and the data strobe signal DQS output from the memory device. The sampling point may be placed in the center of the data valid window through the training.

However, the data input/output signal DQ or the data strobe signal DQS may be shifted while accessing the memory device due to voltage or temperature variation, and thus, a read margin or the data valid window may decrease. Accordingly, even after the training, the memory controller to control the memory device may adjust the data input/output signal DQ or the data strobe signal DQS such that the sampling point is placed in the center of the data valid window.

To determine the data valid window, a related art memory controller may, for example, repeatedly sample the data input/output signal DQ while changing the sampling point. That is, to change the sampling point, the related art memory controller may apply an offset to the data strobe signal DQS and may repeatedly issue the read command. However, a time taken to determine the data valid window may increase due to the iterative read command.

According to an exemplary embodiment, the read margin control circuit 100 may determine the data valid window by sampling delay signals of the data input/output signal DQ based on the data strobe signal DQS through one read command. That is, the read margin control circuit 100 may determine the data valid window without having to repeatedly issue the read command in an iterative manner (i.e., without using an iterative read command).

Figure 2:
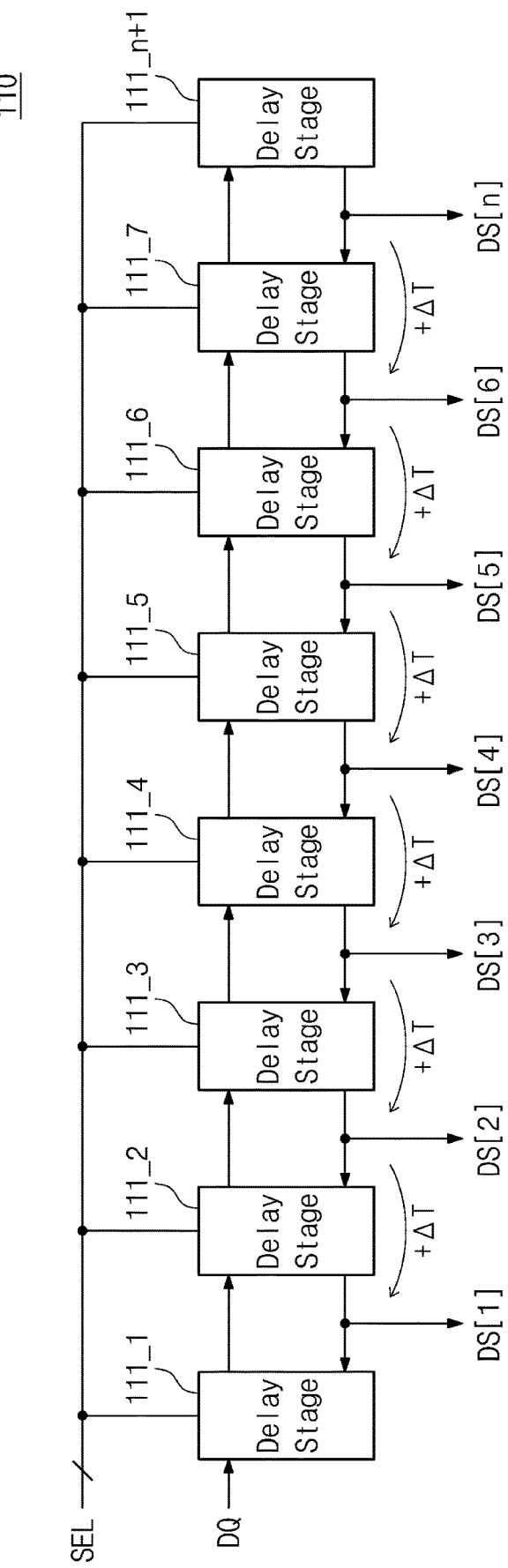
FIG. 2 is a block diagram illustrating a delay circuit of the read margin control circuit of FIG. 1.

FIG. 2 is a block diagram illustrating a delay circuit of the read margin control circuit of FIG. 1. The delay circuit 110 may include first to (n+1)-th delay stages 111_1 to 111_$n$+1 connected in series or in cascade. The first to (n+1)-th delay stages 111_1 to 111_$n$+1 may be implemented to be the same as each other. Here, "n" is an integer of 2 or more, and the number of the first to (n+1)-th delay stages 111_1 to 111_$n$+1 is not limited to the number illustrated in FIG. 2. For example, as the number of the first to (n+1)-th delay stages 111_1 to 111_$n$+1 increases, the size of the data valid window that the read margin control circuit 100 determines may increase.

The first delay stage 111_1 may delay the data input/output signal DQ and may delay a return signal of the second delay stage 111_2, based on a selection signal SEL. The first delay stage 111_1 may return the data input/output signal DQ based on the selection signal SEL.

The second delay stage 111_2 may delay a signal delayed by the first delay stage 111_1 and may delay a return signal of the third delay stage 111_3, based on the selection signal SEL. The second delay stage 111_2 may return the signal delayed by the first delay stage 111_1 based on the selection signal SEL. Each of the third to (n+1)-th delay stages 111_3 to 111_$n$+1 may operate substantially similar to the second delay stage 111_2.

In some exemplary embodiments, the selection signal SEL may include (n+1) bits, the number of which is the same as the number of the first to (n+1)-th delay stages 111_1 to 111_*n*+1. Each of the (n+1) bits may include a first logical value (e.g., logic "0") or a second logical value (e.g., logic "1"). For example, a delay stage that receives the first logical value may output a delay signal transmitted from a previous delay stage to a next delay stage. In contrast, a delay stage that receives the second logical value may return a delay signal transmitted from a previous delay stage to the previous delay stage. One of the first to (n+1)-th delay stages 111_1 to 111_*n*+1 may receive a bit of the selection signal SEL having the second logical value, and the remaining delay stages may receive bits of the selection signal SEL having the first logical value.

An example is illustrated in FIG. 2 in which the (n+1)-th delay stage 111_*n*+1 returns a delay signal transmitted from the seventh delay stage 111_7 to the seventh delay stage 111_7. However, any one of the first to seventh delay stages 111_1 to 111_7 other than the (n+1)-th delay stage 111_*n*+1 may return a delay signal transmitted from a previous stage to the previous stage.

The signal returned from the (n+1)-th delay stage 111_*n*+1 may serially pass through the seventh to first delay stages 111_7 to 111_1. First to n-th delay signals DS[1:n] may be respectively output from the second to (n+1)-th delay stages 111_2 to 111_*n*+1. The sixth delay signal DS[6] may be further delayed by ΔT with respect to the n-th delay signal DS[n], and the fifth delay signal DS[5] may be further delayed by ΔT with respect to the sixth delay signal DS[6]. That is, a delay difference between the first to n-th delay signals DS[1:n] may be ΔT. ΔT may indicate a propagation delay of the first to (n+1)-th delay stages 111_1 to 111_*n*+1. A phase difference of the first to n-th delay signals DS[1:n] may be determined depending on ΔT. As ΔT becomes smaller, the data valid window may be determined more minutely.

Figure 3:
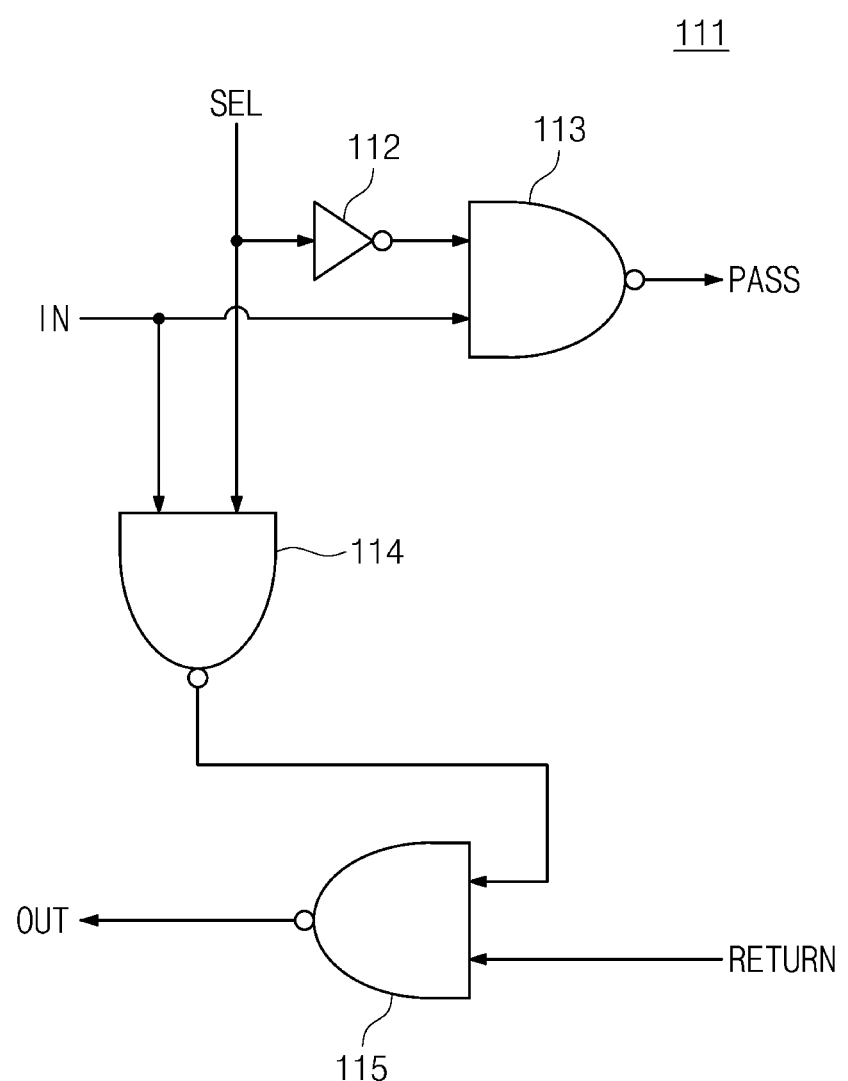
FIG. 3 is a block diagram illustrating a delay stage of the delay circuit of FIG. 2, according to an exemplary embodiment.

FIG. 3 is a block diagram illustrating a delay stage of the delay circuit of FIG. 2, according to an exemplary embodiment. The delay stage 111 may be one of the first to (n+1)-th delay stages 111_1 to 111_*n*+1. The delay stage 111 may include an inverter 112 and NAND gates 113 to 115.

The inverter 112 may invert the selection signal SEL. The NAND gate 113 may delay an input signal IN and may output a pass signal PASS to a next delay stage, based on an inverted selection signal. The NAND gate 114 may output the input signal IN to the NAND gate 115 based on the selection signal SEL. Here, the input signal IN may be transmitted from a previous delay stage. For example, if the selection signal SEL includes the first logical value, the input signal IN may be delayed and output as the pass signal PASS. If the selection signal SEL includes the second logical value, the input signal IN may be returned.

The NAND gate 115 may receive an output of the NAND gate 114 and a return signal RETURN and may output an output signal OUT. Here, the return signal RETURN may be transmitted from a next delay stage. For example, the propagation delay (ΔT of FIG. 2) of the delay stage 111 may be a propagation delay of the NAND gate 115.

Figure 4:
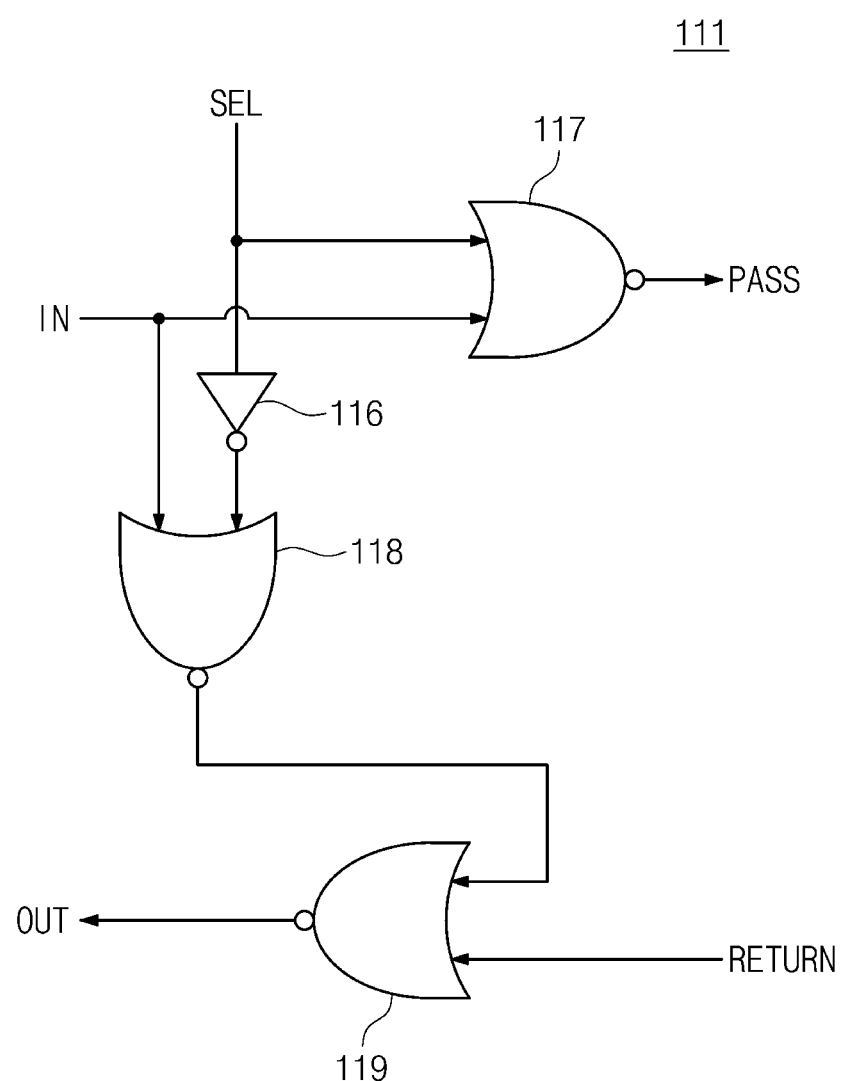
FIG. 4 is a block diagram illustrating a delay stage of the delay circuit of FIG. 2, according to another exemplary embodiment.

FIG. 4 is a block diagram illustrating a delay stage of the delay circuit of FIG. 2, according to another exemplary embodiment. FIG. 4 will be described with reference to FIG. 3. The delay stage 111 of FIG. 4 may operate to be similar to the delay stage 111 of FIG. 3. Unlike the delay stage 111 of FIG. 3, the delay stage 111 of FIG. 4 may be implemented by using NOR gates instead of NAND gates. As the delay stage 111 are implemented with NOR gates 117 to 119 instead of NAND gates, an output of an inverter 116 may be provided to the NOR gate 118. For example, the propagation delay of the delay stage 111 may be a propagation delay of the NOR gate 119. The propagation delay of the delay stage 111 may be a propagation delay of a logic gate such as a NAND gate or a NOR gate.

Figure 5:
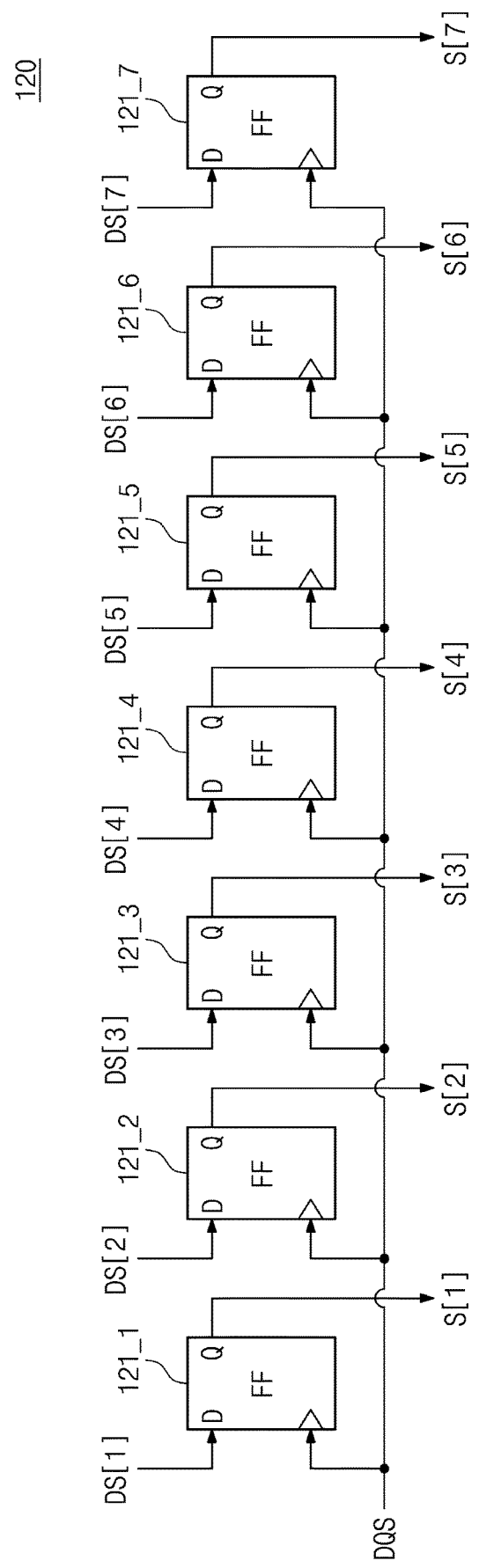
FIG. 5 is a block diagram illustrating a sampler of the read margin control circuit of FIG. 1, according to an exemplary embodiment.

FIG. 5 is a block diagram illustrating a sampler of the read margin control circuit of FIG. 1, according to an exemplary embodiment. FIG. 5 will be described with reference to FIGS. 1 and 2. In FIG. 5, it is assumed that the delay circuit 110 of FIG. 2 includes first to eighth delay stages 111_1 to 111_8 and first to seventh delay signals DS[1:7] are respectively output from the second to eighth delay stages 111_2 to 111_8 (i.e., n being 7).

The sampler 120 includes first to seventh flip-flops 121_1 to 121_7. The first to seventh flip-flops 121_1 to 121_7 may sample the first to seventh delay signals DS[1:7] at a rising edge or a falling edge of the data strobe signal DQS and may output first to seventh sampling values S[1:7].

In some exemplary embodiments, the number of the first to seventh flip-flops 121_1 to 121_7 included in the sampler 120 may be identical to the number of the first to seventh delay signals DS[1:7]. Of course, the number of the first to seventh flip-flops 121_1 to 121_7 is not limited to the number illustrated in FIG. 5.

In some exemplary embodiments, the first to seventh flip-flops 121_1 to 121_7 may be implemented to be the same as each other and may be arranged in the form of an array. Similar to the first to eighth delay stages 111_1 to 111_8 of the delay circuit 110, the first to seventh flip-flops 121_1 to 121_7 may be disposed in series. The first to seventh flip-flops 121_1 to 121_7 may be disposed adjacent to the delay circuit 110 such that lengths of transmission paths of the first to seventh delay signals DS[1:7] are the same as each other. Here, the transmission paths of the first to seventh delay signals DS[1:7] may be from the second to eighth delay stages 111_2 to 111_8, to the first to seventh flip-flops 121_1 to 121_7.

Figure 6:
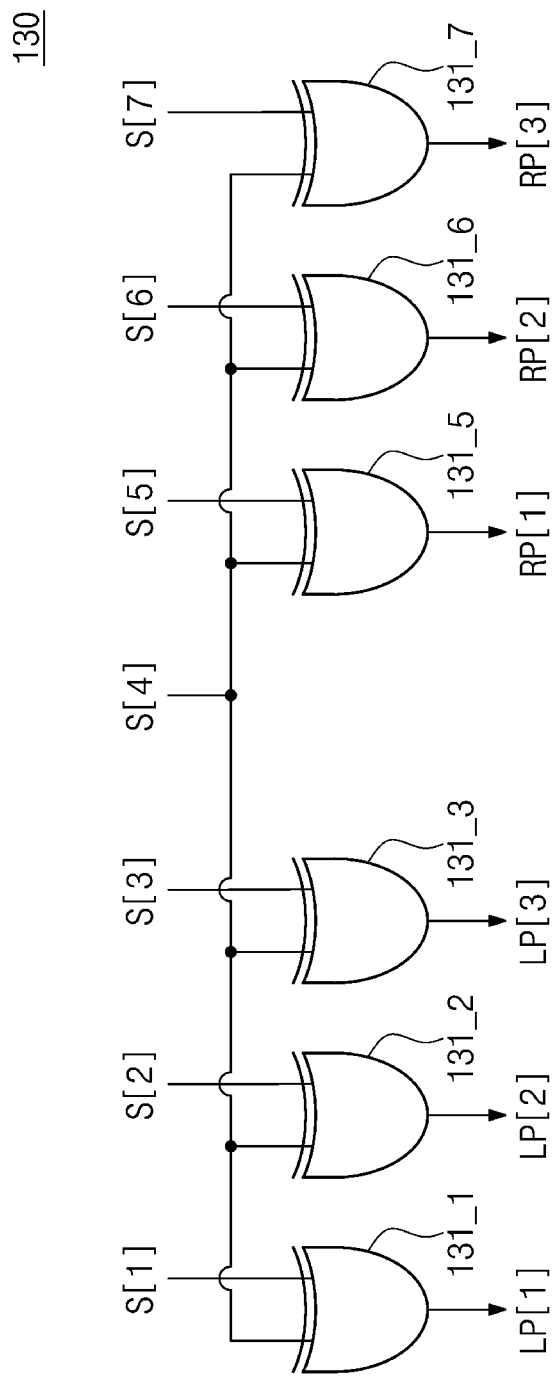
FIG. 6 is a block diagram illustrating a determiner of the read margin control circuit of FIG. 1, according to an exemplary embodiment.

FIG. 6 is a block diagram illustrating a determiner of the read margin control circuit of FIG. 1, according to an exemplary embodiment. FIG. 6 will be described with reference to FIGS. 1, 2, and 5. In FIG. 6, it is assumed that the delay circuit 110 of FIG. 2 includes the first to eighth delay stages 111_1 to 111_8 and first to seventh delay signals DS[1:7] are respectively output from the second to eighth delay stages 111_2 to 111_8. The first to seventh sampling values S[1:7] may be values obtained by sampling the first to seventh delay signals DS[1:7].

The determiner 130 may compare the fourth sampling value S[4] with each of the first to third sampling values S[1:3] and the fifth to seventh sampling values S[5:7]. The fourth sampling value S[4] may be a value obtained by sampling the fourth delay signal DS[4], and the fourth delay signal DS[4] may be a center delay signal of the first to seventh delay signals DS[1:7]. That is, the delay circuit 110 may generate the fourth delay signal DS[4], the fifth to seventh delay signals DS[5:7] less delayed than the fourth delay signal DS[4] (or the total delay amounts of which are smaller than that of the fourth delay signal DS[4]), and the first to third delay signals DS[1:3] further delayed than the fourth delay signal DS[4] (or the total delay amounts of which are greater than that of the fourth delay signal DS[4]). In other words, the fifth to seventh delay signals DS[5:7] may be ahead of the fourth delay signal DS[4] and the fourth delay signal DS[4] may be followed by the first to third delay signals DS[1:3]. Here, in the case where the delay circuit 110 outputs odd delay signals DS[1:n], the center delay signal may be a (n+1)/2-th delay signal DS[(n+1)/2].

The determiner 130 may determine the data valid window based on the fourth sampling value S[4]. The determiner 130 may determine whether each of the first to third sampling values S[1:3] is matched with the fourth sampling value S[4]. The determiner 130 may determine whether each of the fifth to seventh sampling values S[5:7] is matched with the fourth sampling value S[4]. To this end, the determiner 130 may include first to third exclusive OR (XOR) gates 131_1 to 131_3 and fifth to seventh XOR gates 131_5 to 131_7.

The first XOR gate 131_1 may generate a first left parity signal LP[1] indicating whether the first sampling value S[1] is matched with the fourth sampling value S[4]. Similar to the above description, the second and third XOR gates 131_2 and 131_3 may generate second and third left parity signals LP[2:3], respectively, indicating whether the second and third sampling values S[2:3], respectively, are matched with the fourth sampling value S[4]. The first to third left parity signals LP[1:3] that are obtained as a result of comparing the first to third sampling values S[1:3] with the fourth sampling value S[4] may indicate a left valid window margin Left VWM of the data valid window.

The fifth XOR gate 131_5 may generate a first right parity signal RP[1] indicating whether the fifth sampling value S[5] is matched with the fourth sampling value S[4]. Similar to the above description, the sixth and seventh XOR gates 131_6 and 131_7 may generate second and third right parity signals RP[2:3], respectively, indicating whether the sixth and seventh sampling values S[6:7], respectively, are matched with the fourth sampling value S[4]. The first to third right parity signals RP[1:3] that are obtained as a result of comparing the fifth to seventh sampling values S[5:7] with the fourth sampling value S[4] may indicate a right valid window margin Right VWM of the data valid window.

In some exemplary embodiments, the case where a parity signal is at a first logical state may indicate that sampling values are matched with each other, and the case where a parity signal is at a second logical state may indicate that sampling values are not matched with each other. However, in other exemplary embodiments, the opposite may be adopted such that the case where a parity signal is at the second logical state may indicate that sampling values are matched with each other, and the case where a parity signal is at the first logical state may indicate that sampling values are not matched with each other.

The determiner 130 may include logic gates that perform an exclusive OR operation or an exclusive NOR operation on the first to seventh sampling values S[1:7]. An example is illustrated in FIG. 6 that the logic gates are XOR gates, but in other exemplary embodiments, the logic gates may be implemented with XNOR gates. The number of logic gates may be determined depending on the number of sampling values.

Figure 7:
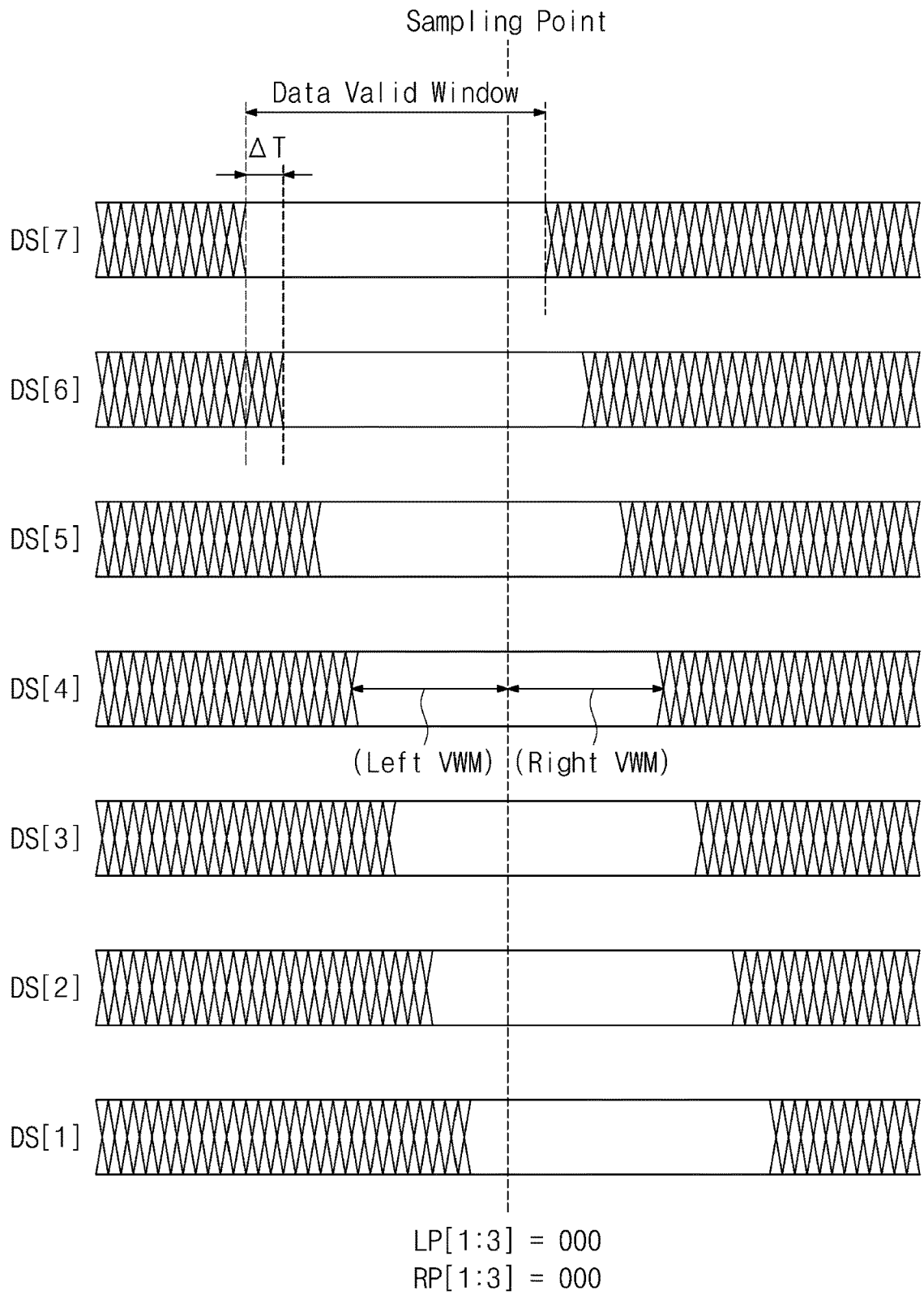
FIGS. 7 to 9 are views illustrating delay signals of the delay circuit of FIG. 2 and left parity signals and right parity signals of the determiner of FIG. 6.
Figure 8:
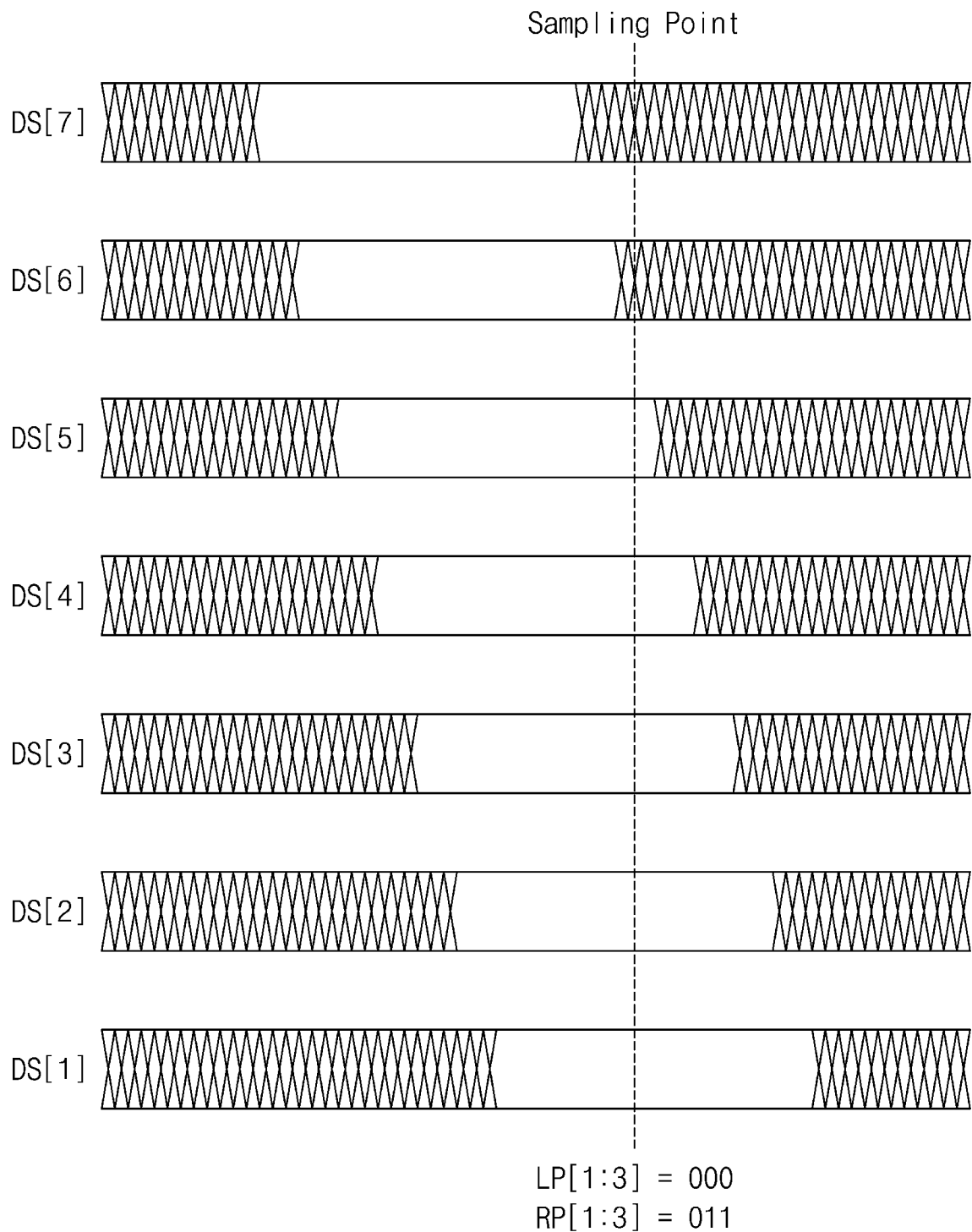
Figure 9:
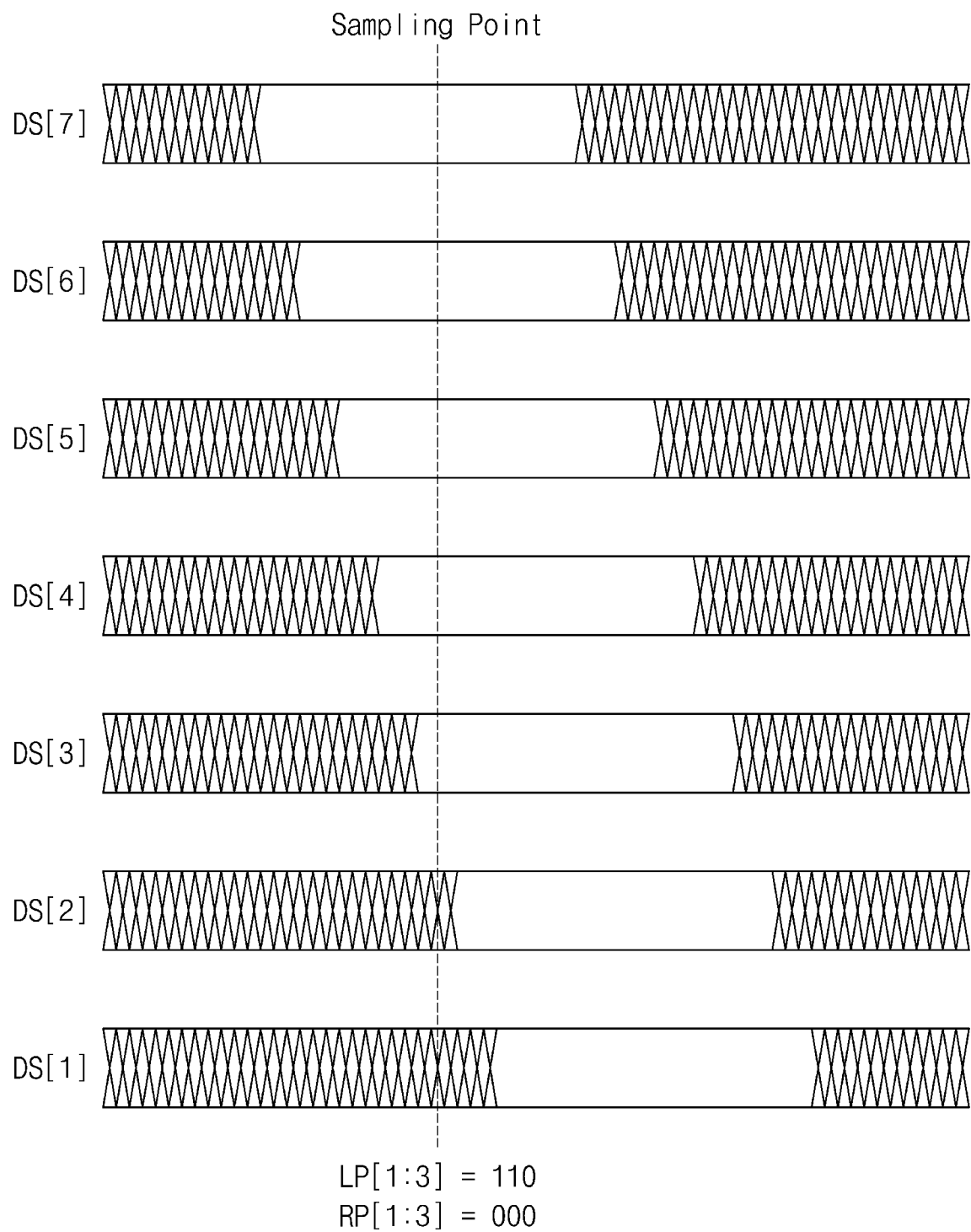

FIGS. 7 to 9 are views illustrating delay signals of the delay circuit of FIG. 2 and left parity signals and right parity signals of the determiner of FIG. 6. FIGS. 7 to 9 will be described with reference to FIGS. 1, 2, and 6 together. It is assumed that the first to seventh delay signals DS[1:7] are output from the delay circuit 110.

The data valid window of the seventh delay signal DS[7] may be formed in any period. The data valid window of the sixth delay signal DS[6] may be delayed by ΔT with respect to the data valid window of the seventh delay signal DS[7]. As in the above description, the data valid window of each of the first to fifth delay signals DS[1:5] may be delayed by ΔT. As described above, ΔT may indicate a propagation delay of a delay stage.

The first to seventh delay signals DS[1:7] may be sampled by the sampler 120 at the sampling point. The first to third XOR gates 131_1 to 131_3 may generate the first to third left parity signals LP[1:3]. The fifth to seventh XOR gates 131_5 to 131_7 may generate the first to third right parity signals RP[1:3].

FIG. 7 may indicate the case where the sampling point is placed in the center of the data valid window of the fourth delay signal DS[4]. A left valid window margin Left VWM and a right valid window margin Right VWM may be the same as each other with respect to the fourth delay signal DS[4]. For example, the sampling point may be inside all the data valid windows of the first to seventh delay signals DS[1:7]. Each of the first to third sampling values S[1:3] and the fifth to seventh sampling values S[5:7] may be matched with the fourth sampling value S[4]. Accordingly, the first to third left parity signals LP[1:3] may be "000", and the first to third right parity signals RP[1:3] may be "000". Here, a logical value of a parity signal may be an exemplary value.

FIG. 8 may indicate the case where the sampling point is placed on the right of the data valid window of the fourth delay signal DS[4]. The right valid window margin Right VWM may be smaller than the left valid window margin Left VWM with respect to the fourth delay signal DS[4]. For example, the sampling point may be inside the data valid windows of the first to fifth delay signals DS[1:5] and may be outside the data valid windows of the sixth and seventh delay signals DS[6:7]. Unlike the description given with reference to FIG. 8, the sampling point may be outside data valid windows of one or more of the fifth to seventh delay signals DS[5:7]. For example, in some cases, the sampling point may be outside the data valid window of DS[7] but inside the data valid window of DS[6] and DS[5] (i.e., RP[1:3]=001), whereas in another example, the sampling point may be outside the data valid window of DS[5:7] (i.e., RP[1:3]=111).

In the example shown in FIG. 8, each of the first to third sampling values S[1:3] may be matched with the fourth sampling value S[4]. The first to third left parity signals LP[1:3] may be "000". The fifth sampling value S[5] may be matched with the fourth sampling value S[4], but the sixth and seventh sampling values S[6:7] may not be matched with the fourth sampling value S[4]. The first to third right parity signals RP[1:3] may be "011". Here, a logical value of a parity signal may be an exemplary value. That the sampling point is placed on the right of the data valid window may be determined through the first to third left parity signals LP[1:3] and the first to third right parity signals RP[1:3].

FIG. 9 may indicate the case where the sampling point is placed on the left of the data valid window of the fourth delay signal DS[4]. The left valid window margin Left VWM may be smaller than the right valid window margin Right VWM with respect to the fourth delay signal DS[4]. For example, the sampling point may be inside the data valid windows of the third to seventh delay signals DS[3:7] and may be outside the data valid windows of the first and second delay signals DS[1:2]. Unlike the description given with reference to FIG. 9, the sampling point may be outside data valid windows of one or more of the first to third delay signals DS[1:3]. For example, in some cases, the sampling point may be outside the data valid window of DS[1] but inside the data valid window of DS[2] and DS[3] (i.e., LP[1:3]=100), whereas in another example, the sampling point may be outside the data valid window of DS[1:3] (i.e., LP[1:3]=111).

In the example shown in FIG. 9, each of the fifth to seventh sampling values S[5:7] may be matched with the fourth sampling value S[4]. The first to third right parity signals RP[1:3] may be "000". The third sampling value S[3] may be matched with the fourth sampling value S[4], but the first and second sampling values S[1:2] may not be matched with the fourth sampling value S[4]. The first to third left parity signals LP[1:3] may be "110". Here, a logical value of a parity signal may be an exemplary value. That the sampling point is placed on the left of the data valid window may be determined through the first to third left parity signals LP[1:3] and the first to third right parity signals RP[1:3].

Figure 10:
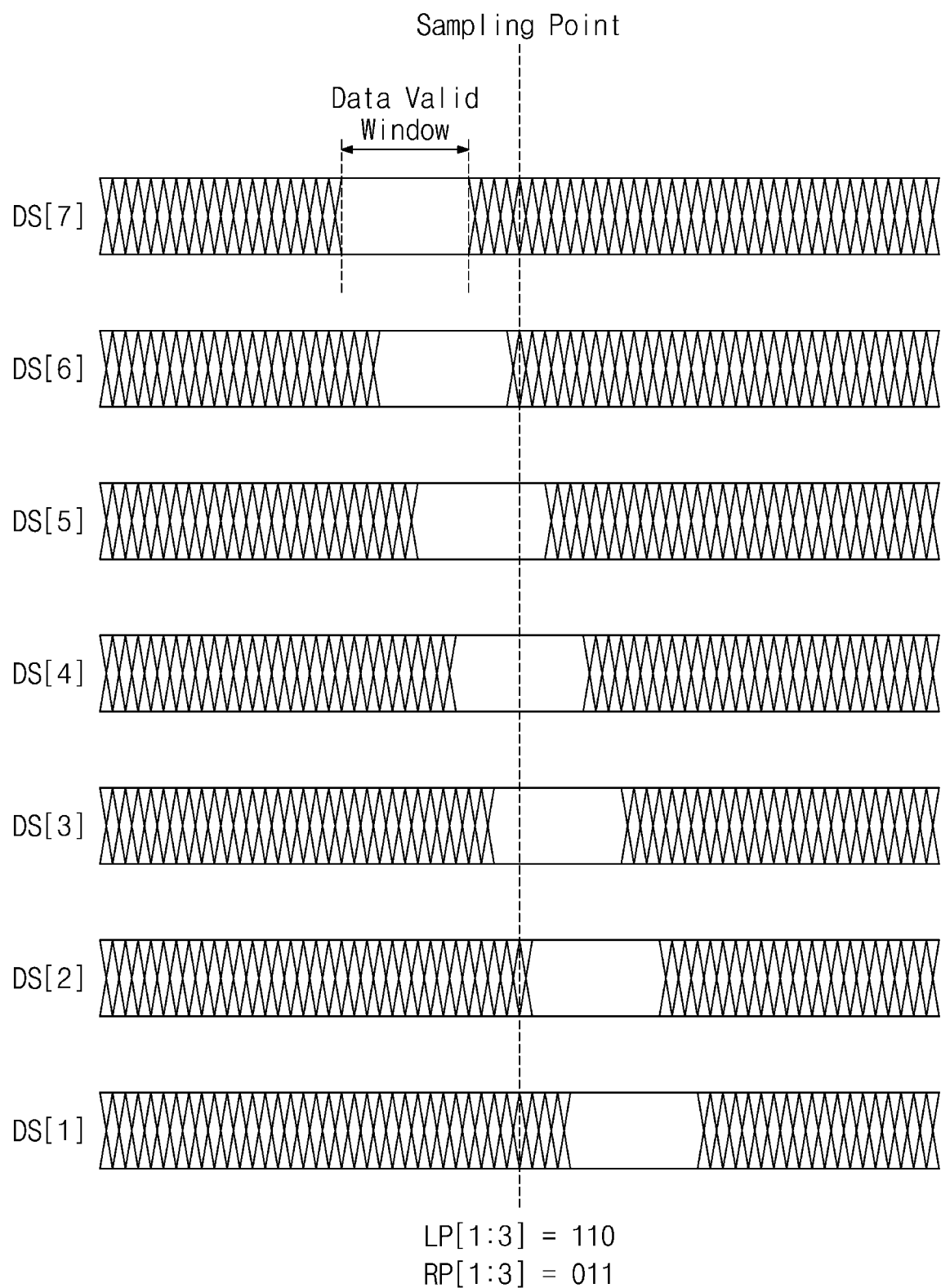
FIGS. 10 to 11 are views illustrating delay signals of the delay circuit of FIG. 2 and left parity signals and right parity signals of the determiner of FIG. 6.
Figure 11:
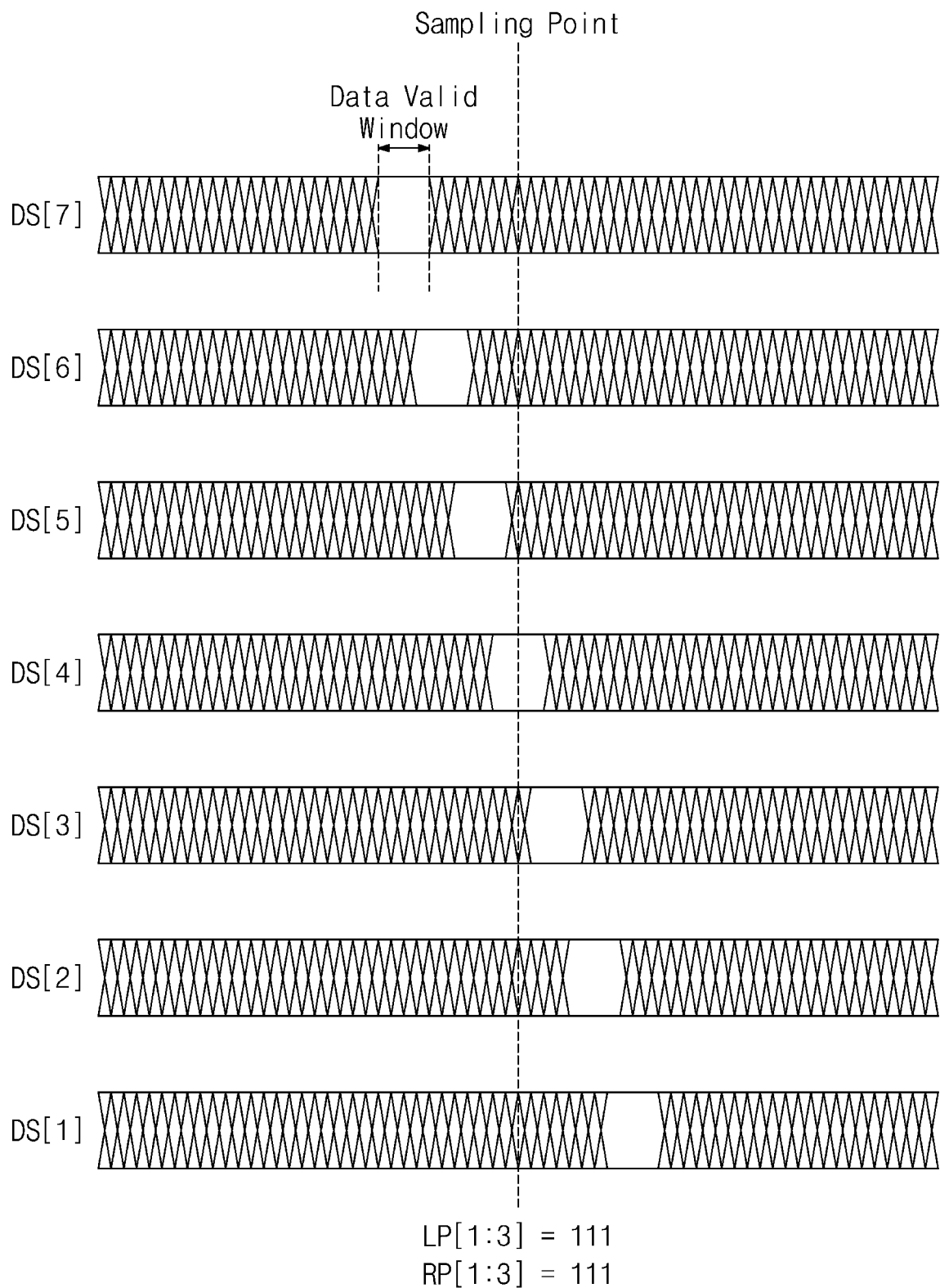

FIGS. 10 to 11 are views illustrating delay signals of the delay circuit of FIG. 2 and left parity signals and right parity signals of the determiner of FIG. 6. FIGS. 10 and 11 will be described with reference to FIGS. 1, 2, 6, and 7. It is assumed that the first to seventh delay signals DS[1:7] are output from the delay circuit 110.

According to an exemplary embodiment, various examples where the sampling point is placed in the data valid window are described with respect to o FIGS. 7 to 9. According to another exemplary embodiment, the size of the data valid window (i.e., an absolute data valid window margin) may be determined.

FIG. 10 may indicate the case where the size of a data valid window of FIG. 7 decreases. For example, the sampling point may be inside the data valid windows of the third to fifth delay signals DS[3:5] and may be outside the data valid windows of the first, second, sixth, and seventh delay signals DS[1], DS[2], DS[6], and DS[7]. Each of the third and fifth sampling values S[3,5] may be matched with the fourth sampling value S[4], but the first, second, sixth, and seventh sampling values S[1], S[2], S[6], and S[7] may not be matched with the fourth sampling value S[4].

Accordingly, the first to third left parity signals LP[1:3] may be "110", and the first to third right parity signals RP[1:3] may be "011". That the size of the data valid window decreases may be determined through the first to third left parity signals LP[1:3] and the first to third right parity signals RP[1:3]. That is, since each of the left parity signals and the right parity signals have bits indicating that the sampling point is outside the data valid window, the size of the data valid window may be determined to be smaller than the data valid window of FIG. 7.

FIG. 11 may indicate the case where the size of a data valid window of FIG. 7 further decreases. For example, the sampling point may be inside the data valid window of the fourth delay signal DS[4] and may be outside the data valid windows of the first, second, third, fifth, sixth, and seventh delay signals DS[1], DS[2], DS[3], DS[5], DS[6], and DS[7]. Each of the first, second, third, fifth, sixth, and seventh sampling values S[1], S[2], S[3], S[5], S[6], and S[7] may not be matched with the fourth sampling value S[4].

Accordingly, the first to third left parity signals LP[1:3] may be "111", and the first to third right parity signals RP[1:3] may be "111". That the size of the data valid window further decreases may be determined through the first to third left parity signals LP[1:3] and the first to third right parity signals RP[1:3].

In some exemplary embodiments, the determiner 130 may determine the size of the data valid window based on at least one sampling value, which is matched with the fourth sampling value S[4], from among the first, second, third, fifth, sixth, and seventh sampling values S[1], S[2], S[3], S[5], S[6], and S[7]. The determiner 130 may decode the first to third left parity signals LP[1:3] and the first to third right parity signals RP[1:3] and may determine sampling values matched with the fourth sampling value S[4] among the first, second, third, fifth, sixth, and seventh sampling values S[1], S[2], S[3], S[5], S[6], and S[7].

Figure 12:
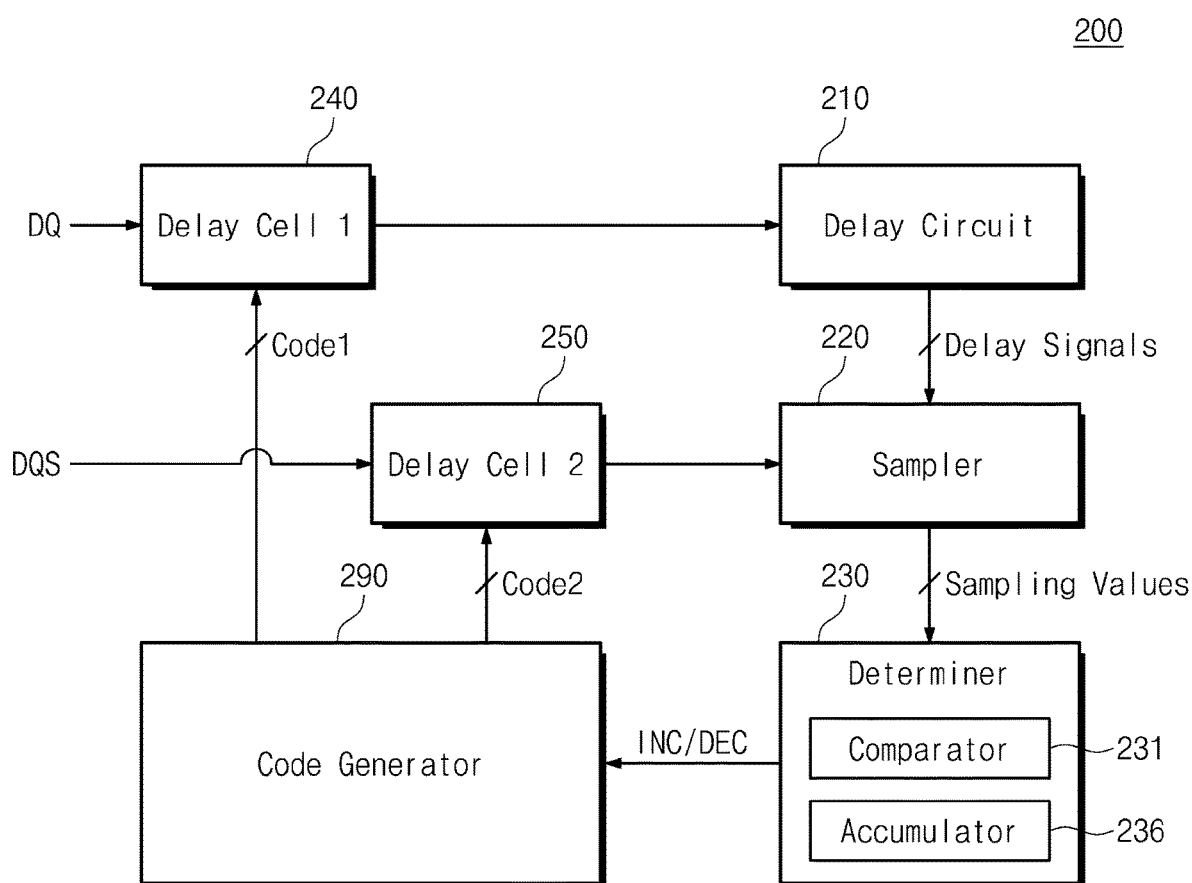
FIG. 12 is a block diagram illustrating a read margin control circuit according to another exemplary embodiment.

FIG. 12 is a block diagram illustrating a read margin control circuit according to another exemplary embodiment. FIG. 12 will be described with reference to FIGS. 1 and 6. A read margin control circuit 200 may include a delay circuit 210, a sampler 220, a determiner 230, a first delay cell Delay Cell 1 240, a second delay cell Delay Cell 2 250, and a code generator 290.

Unlike the delay circuit 110, the delay circuit 210 may receive an output of the first delay cell 240 by which the data input/output signal DQ is delayed. The delay circuit 210 may operate similarly to the delay circuit 110 except for the above difference. The delay circuit 210 may delay the output of the first delay cell 240 and may generate delay signals having different phases.

Unlike the sampler 120, the sampler 220 may receive an output of the second delay cell 250 by which the data strobe signal DQS is delayed. The sampler 220 may operate similarly to the sampler 120 except for the above difference. The sampler 220 may sample delay signals output from the delay circuit 210 based on a data strobe signal delayed by the second delay cell 250.

The determiner 230 may include a comparator 231 and an accumulator 236. The comparator 231 may compare sampling values of the sampler 220. The comparator 231 may include the first to third XOR gates 131_1 to 131_3 and the fifth to seventh XOR gates 131_5 to 131_7, which are described with reference to FIG. 6. That is, the determiner 230 may operate to be similar to the determiner 130.

The accumulator 236 may accumulate a comparison result from the comparator 231. For example, data input/output signals may include various read data for determining the data valid window. One or more read commands may be transmitted to a memory device (not illustrated), and one or more data input/output signals may be transmitted from the memory device. The accumulator 236 may accumulate a comparison result of the comparator 231 for the data input/output signals.

The determiner 230 may determine the data valid window based on the comparison result of the comparator 231 and the accumulation result of the accumulator 236. The determiner 230 may transmit an increasing signal INC or a decreasing signal DEC to the code generator 290 for changing a first code Code1 or a second code Code2.

In some exemplary embodiments, the unit or the amount of delay of the first delay cell 240, which are adjusted according to the first code Code1, may correspond to a propagation delay of each of the first to (n+1)-th delay stages 111_1 to 111_n+1 described with reference to FIG. 2. A delay of the first delay cell 240, which is changed according to a least significant bit (LSB) of the first code Code1, may correspond to a propagation delay of a delay stage. Similar to the above description, the unit or the amount of delay of the second delay cell 250, which are adjusted according to the second code Code2, may correspond to a propagation delay of a delay stage. A delay of the second delay cell 250, which is changed according to an LSB of the second code Code2, may also correspond to a propagation delay of a delay stage.

The read margin control circuit 200 may further include the first delay cell 240 and the second delay cell 250 compared with the read margin control circuit 100 of FIG. 1. In the example illustrated in FIG. 12, the read margin control circuit 200 includes both the first delay cell 240 and the second delay cell 250. However, in some exemplary embodiments, the read margin control circuit 200 may include only one of the first delay cell 240 and the second delay cell 250.

The first delay cell 240 may receive the data input/output signal DQ. The first delay cell 240 may delay the data input/output signal DQ based on the first code Code1. The first delay cell 240 may be a variable delay cell in which the amount of delay of the data input/output signal DQ is determined depending on the first code Code1.

In some exemplary embodiments, the amount of delay of the data input/output signal DQ by the first delay cell 240 may be changed in a digital manner based on the first code Code1. The first delay cell 240 may be implemented with at least one logic gate (e.g., an inverter) receiving the first code Code1. Alternatively, the first delay cell 240 may be implemented to be similar to the delay circuit 210. In another exemplary embodiment, the amount of delay of the data input/output signal DQ by the first delay cell 240 may be changed in an analog manner based on a voltage or a current corresponding to the first code Code1.

The second delay cell 250 may receive the data strobe signal DQS. The second delay cell 250 may delay the data strobe signal DQS based on the second code Code2. The second delay cell 250 may be a variable delay cell in which the amount of delay of the data strobe signal DQS is determined depending on the second code Code2. For example, the second delay cell 250 may be implemented similarly to the first delay cell 240. That is, the amount of delay of the second delay cell 250 may be changed in a digital or analog manner.

The code generator 290 may generate the first code Code1 for adjusting a delay amount of the first delay cell 240 or the second code Code2 for adjusting a delay amount of the second delay cell 250, based on a determination result of the determiner 230. By the code generator 290, the data input/output signal DQ may be further delayed with respect to the data strobe signal DQS, or in contrast, the data strobe signal DQS may be further delayed with respect to the data input/output signal DQ.

In detail, the code generator 290 may generate the first code Code1 or the second code Code2 based on left parity signals and right parity signals. As described with reference to FIG. 6, the first to third XOR gates 131_1 to 131_3 may generate the first to third left parity signals LP[1:3]. The fifth to seventh XOR gates 131_5 to 131_7 may generate the first to third right parity signals RP[1:3]. The first to third left parity signals LP[1:3] may indicate at least one value not matched with the fourth sampling value S[4] among the first to third sampling values S[1:3]. The first to third right parity signals RP[1:3] may indicate at least one value not matched with the fourth sampling value S[4] among the fifth to seventh sampling values S[5:7].

For example, it is assumed that the sampling point is on the left of the data valid window and a left window margin of the data valid window is insufficient. In this case, at least one of the first to third sampling values S[1:3] may not be matched with the fourth sampling value S[4]. The code generator 290 may generate the first code Code1 or the second code Code2 based on the at least one value not matched with the fourth sampling value S[4], such that the data strobe signal DQS is further delayed with respect to the data input/output signal DQ.

In contrast, in another example, it is assumed that the sampling point is on the right of the data valid window and a right window margin of the data valid window is insufficient. In this case, at least one of the fifth to seventh sampling values S[5:7] may not be matched with the fourth sampling value S[4]. The code generator 290 may generate the first code Code1 or the second code Code2 based on the at least one value not matched with the fourth sampling value S[4], such that the data input/output signal DQ is further delayed with respect to the data strobe signal DQS.

Figure 13:
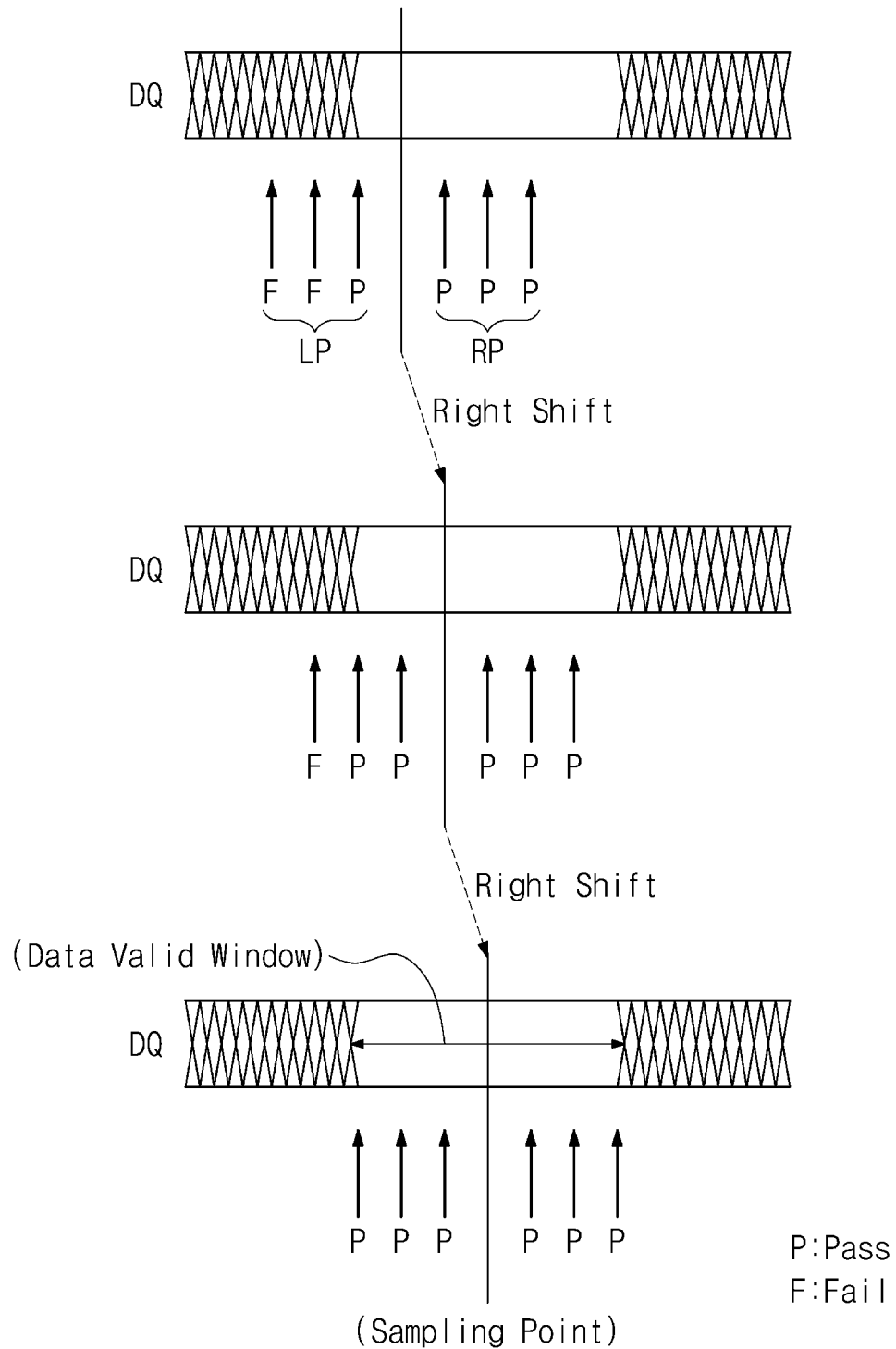
FIGS. 13 and 14 are views illustrating examples in which a data valid window of a data input/output signal is slid by the read margin control circuit of FIG. 12, according to exemplary embodiments.
Figure 14:
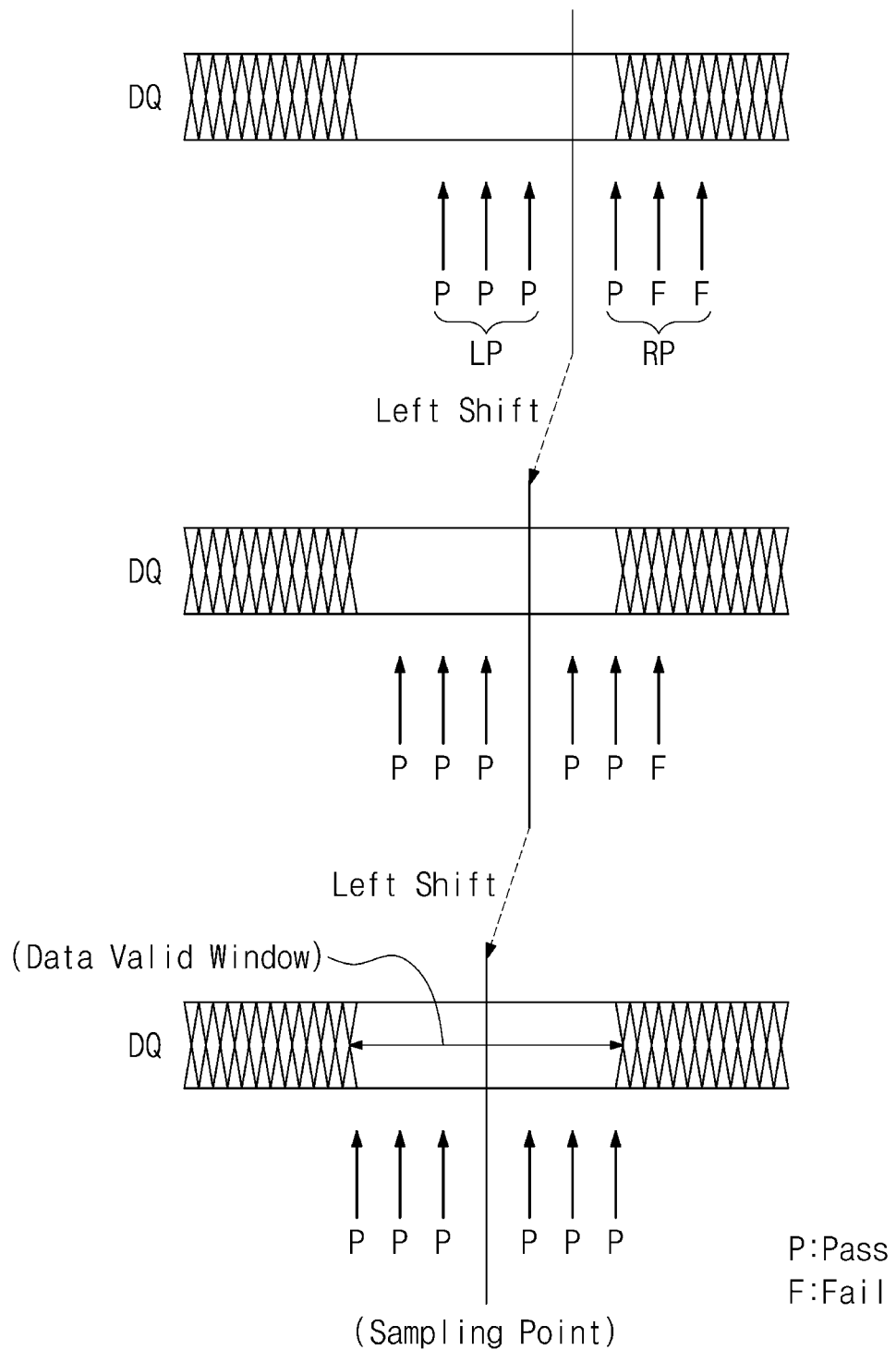

FIGS. 13 and 14 are views illustrating examples in which a data valid window of a data input/output signal is slid by a read margin control circuit of FIG. 12, according to an exemplary embodiment. FIGS. 13 and 14 will be described with reference to FIGS. 6 and 12 together. FIG. 13 relates to the case where the sampling point is shifted toward the right. FIG. 14 relates to the case where the sampling point is shifted toward the left.

Signals (delay signals) generated by delaying the data input/output signal DQ may be sampled at a point indicated by each of arrows illustrated in FIGS. 13 and 14. According to an exemplary embodiment, the sampling point may not be changed by applying an offset to the data strobe signal DQS. The delay signals of the data input/output signal DQ may be generated, and the delay signals may be sampled at the same time.

In FIGS. 13 and 14, "P" and "F" may indicate "pass" and "fail", respectively. The pass may indicate that a value sampled at a point indicated by an arrow is matched with a value sampled in the data valid window. The fail may indicate that a value sampled at a point indicated by an arrow is not matched with a value sampled in the data valid window. For example, the pass and the fail may be generated based on the first to third left parity signals LP[1:3] and the first to third right parity signals RP[1:3], and may be a determination result of the determiner 230 described with reference to FIG. 12.

In FIG. 13, at least one of the first to third left parity signals LP[1:3] may be activated. The first to third left parity signals LP[1:3] may indicate that the sampling point is on the left of the data valid window. The code generator 290 may generate the first code Code1 or the second code Code2 depending on passes and fails illustrated in FIG. 13 and may delay the data strobe signal DQS more than the data input/output signal DQ. The data strobe signal DQS may be further delayed with respect to the data input/output signal DQ based on the code thus generated. Accordingly, the sampling point may be shifted toward the right.

In FIG. 14, at least one of the first to third right parity signals RP[1:3] may be activated. The first to third right parity signals RP[1:3] may indicate that the sampling point is on the right of the data valid window. The code generator 290 may generate the first code Code1 or the second code Code2 depending on passes and fails illustrated in FIG. 14 and may delay the data input/output signal DQS more than the data strobe signal DQS. The data input/output signal DQ may be further delayed with respect to the data strobe signal DQS based on the code thus generated. Accordingly, the sampling point may be shifted toward the left.

Six marks each indicating pass or fail are illustrated in FIGS. 13 and 14, but the inventive concept is not limited thereto. The number of passes and fails may be determined depending on the number of delay signals that the delay circuit 210 generates.

Figure 15:
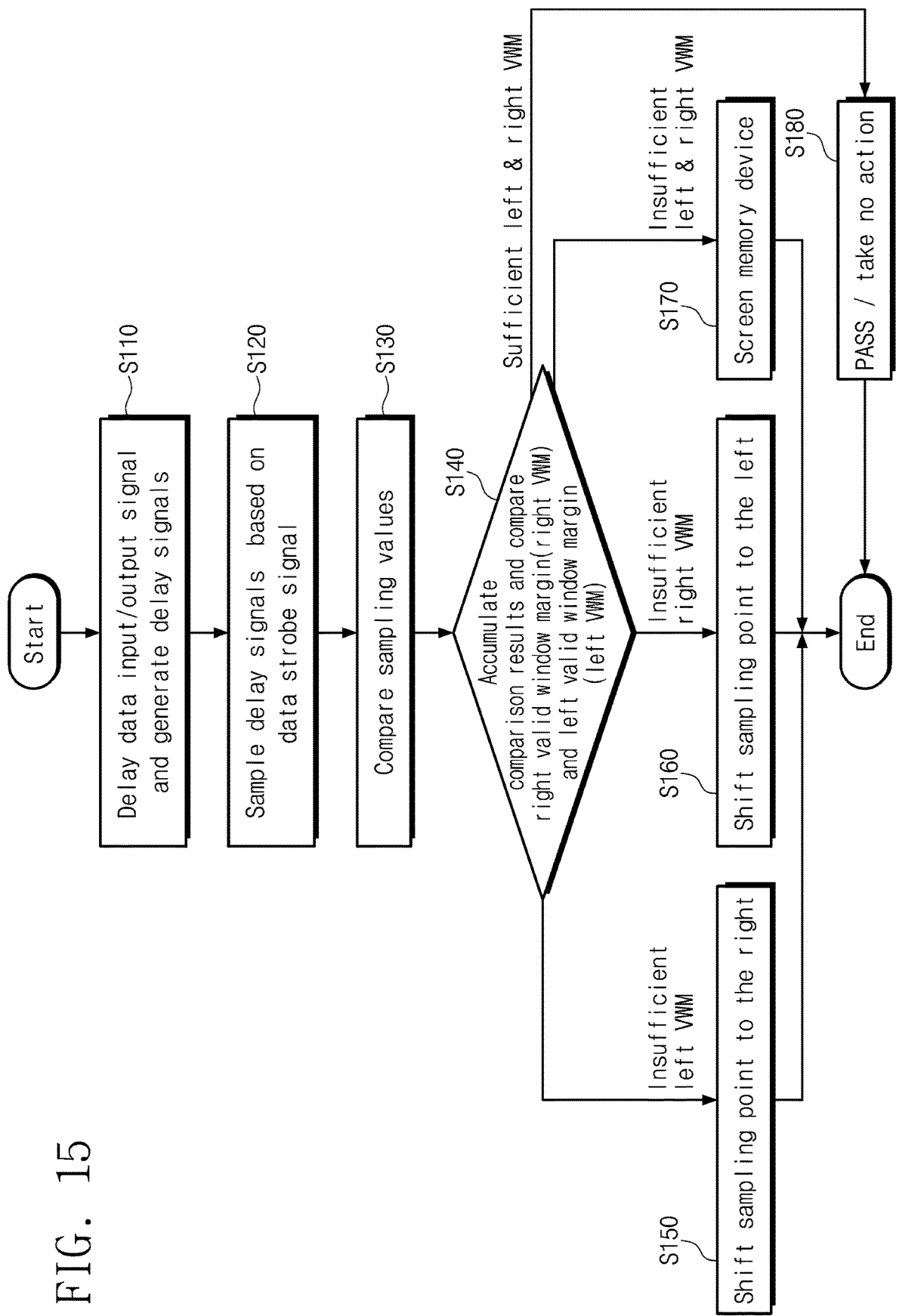
FIG. 15 is a flowchart illustrating operations for controlling a read margin of a data input/output signal, according to an exemplary embodiment.

FIG. 15 is a flowchart illustrating operations for controlling a read margin of a data input/output signal, according to an exemplary embodiment. FIG. 15 will be described with reference to FIGS. 12 to 14.

In operation S110, the delay circuit 210 may delay the data input/output signal DQ and may generate delay signals. For example, the delay circuit 210 may include a digital circuit, such as logic gates, for delaying the data input/output signal DQ. Phases of the delay signals may be different from each other.

In operation S120, the sampler 220 may sample the delay signals based on the data strobe signal DQS. The sampler 120 may generate sampling values including logical values of the delay signals at a rising edge or a falling edge of the data strobe signal DQS.

In operation S130, the determiner 230 may compare the sampling values. The determiner 230 may compare a sampling value sampled a center delay signal (refer to the fourth delay signal DS[4] of FIG. 2) with each of the remaining sampling values.

In operation S140, the determiner 230 may accumulate comparison results and compare right and left valid window margins. As described above, the comparison results may be generated by sampling data input/output signals including various read data and comparing the sampling results. The determiner 230 may determine the data valid window based on the accumulated comparison results. In detail, the determiner 230 may determine whether a left valid window margin is insufficient, whether a right valid window margin is insufficient, or whether all the left and right valid window margins are insufficient.

In operation S150, the left valid window margin (left VWM) of the data valid window may be insufficient (refer to FIG. 13). The code generator 290 may generate the first code Code1 or the second code Code2 such that the data strobe signal DQS is further delayed with respect to the data input/output signal DQ. The code generator 290 may shift the sampling point of the data input/output signal DQ toward the right.

In operation S160, the right valid window margin (right VWM) of the data valid window may be insufficient (refer to FIG. 14). The code generator 290 may generate the first code Code1 or the second code Code2 such that the data input/output signal DQ is further delayed with respect to the data strobe signal DQS. The code generator 290 may shift the sampling point of the data input/output signal DQ toward the left.

In operation S170, all the left VWM and the right VWM of the data valid window may be insufficient. In this case, the determiner 230 may determine that the absolute size of the data valid window is small. For example, the determiner 230 may screen a memory device that generates the data input/output signal DQ. In operation S180, both the left VWM and the right VW of the data valid window may be sufficient. In this case, the determiner 230 may determine that no action is needed.

Figure 16:
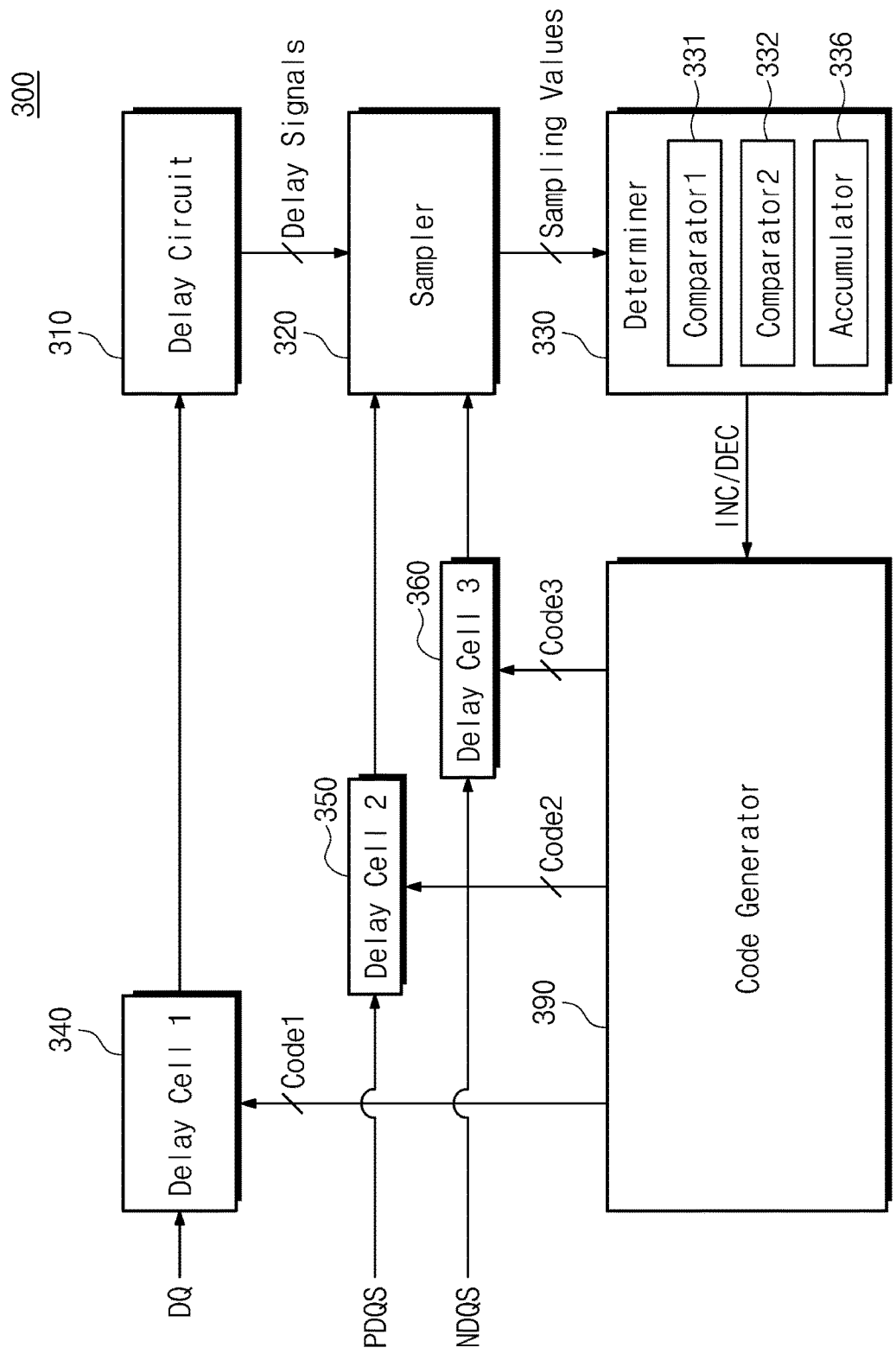
FIG. 16 is a block diagram illustrating a read margin control circuit according to another exemplary embodiment.

FIG. 16 is a block diagram illustrating a read margin control circuit according to another exemplary embodiment. FIG. 16 will be described with reference to FIG. 12. A read margin control circuit 300 may include a delay circuit 310, a sampler 320, a determiner 330, a first delay cell 340, a second delay cell 350, a third delay cell 360, and a code generator 390. Operations of the delay circuit 310 and the first delay cell 340 may be similar to the operations of the delay circuit 210 and the first delay cell 240.

The read margin control circuit 300 may receive a positive data strobe signal PDQS and a negative data strobe signal NDQS transmitted in a differential manner. The second delay cell 350 may delay the positive data strobe signal PDQS based on a second code Code2. The third delay cell 360 may delay the negative data strobe signal NDQS based on a third code Code3. An operation of each of the second delay cell 350 and the third delay cell 360 may be similar to the operation of the second delay cell 250.

The sampler 320 may sample delay signals output from the delay circuit 310 based on the positive data strobe signal PDQS and the negative data strobe signal NDQS, respectively. For example, sampling values that are sampled based on the positive data strobe signal PDQS may correspond to sampling values that are sampled at a rising edge of the data strobe signal DQS of FIG. 12. Sampling values that are sampled based on the negative data strobe signal NDQS may correspond to sampling values that are sampled at a falling edge of the data strobe signal DQS of FIG. 12. That is, the data input/output signal DQ may be sampled at both the rising edge and the falling edge of the data strobe signal DQS. An operation of the sampler 320 may be similar to the operation of the sampler 220.

The determiner 330 may determine the data valid window based on sampling values sampled based on the positive data strobe signal PDQS and the negative data strobe signal NDQS, respectively. For example, the determiner 330 may determine the data valid window, based on sampling values respectively sampled at the rising edge and the falling edge of the data strobe signal DQS by the sampler 320. The determiner 330 may operate to be similar to the determiner 230.

The determiner 330 may include a first comparator 331, a second comparator 332, and an accumulator 336. The first comparator 331 may compare sampling values sampled in synchronization with the positive data strobe signal PDQS. The second comparator 332 may compare sampling values sampled in synchronization with the negative data strobe signal NDQS. An operation of each of the first comparator 331 and the second comparator 332 may be similar to the operation of the comparator 231. An operation of the accumulator 336 may be similar to the operation of the accumulator 236.

The code generator 390 may generate the first code Code1 for adjusting a delay amount of the first delay cell 340, the second code Code2 for adjusting a delay amount of the second delay cell 350, or the third code Code3 for adjusting a delay amount of the third delay cell 360, based on a determination result of the determiner 330. By the code generator 390, the data input/output signal DQ may be further delayed with respect to the positive data strobe signal PDQS and the negative data strobe signal NDQS, or in contrast, the positive data strobe signal PDQS and the negative data strobe signal NDQS may be further delayed with respect to the data input/output signal DQ. An operation of the code generator 390 may be similar to the operation of the code generator 290.

Figure 17:
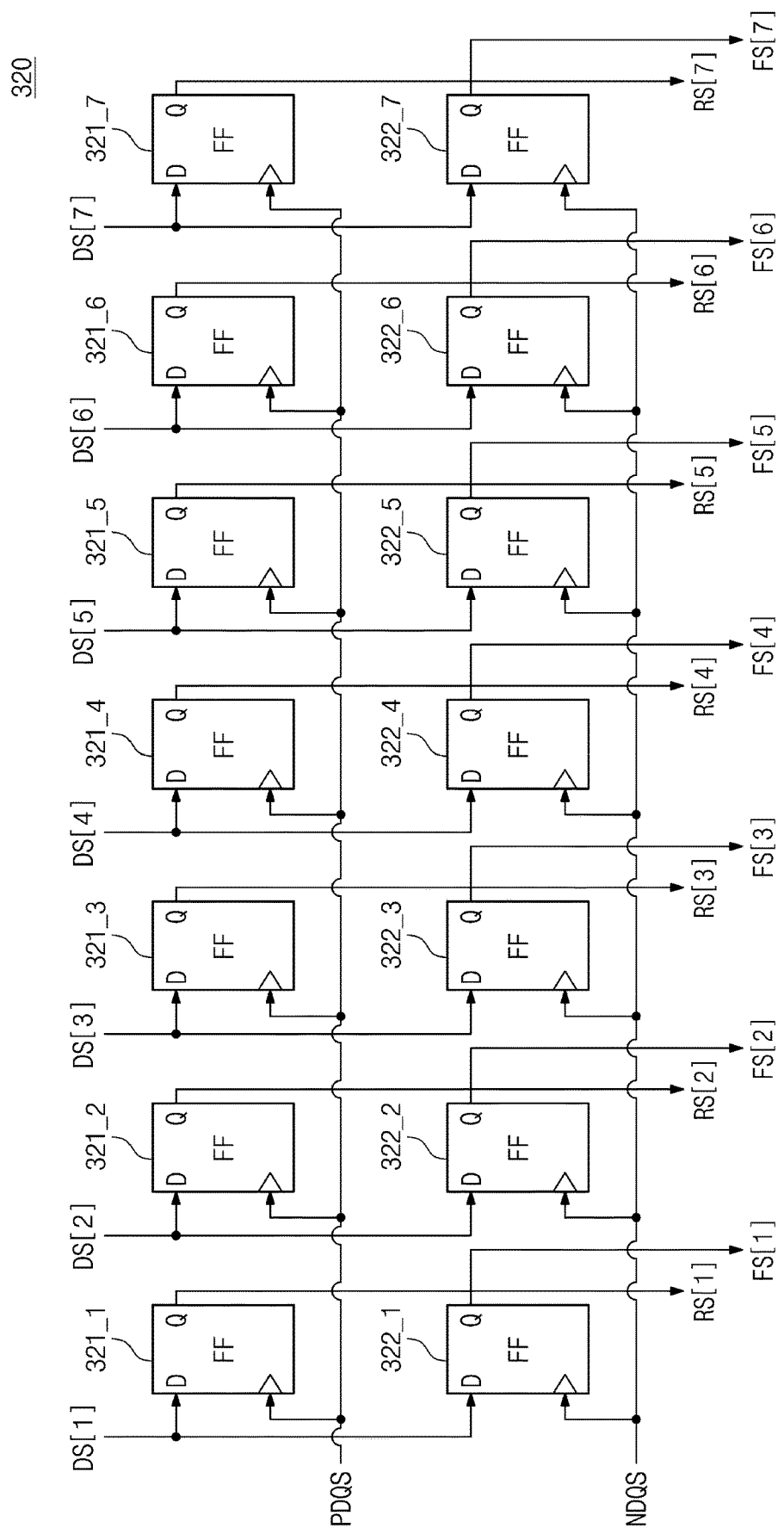
FIG. 17 is a block diagram illustrating a sampler of the read margin control circuit of FIG. 16.

FIG. 17 is a block diagram illustrating a sampler of the read margin control circuit of FIG. 16. FIG. 17 will be described with reference to FIGS. 5 and 16. In FIG. 17, it is assumed that the delay circuit 310 of FIG. 16 includes eight delay stages and the first to seventh delay signals DS[1:7] are output from the delay stages.

The sampler 320 may include first to seventh positive flip-flops 321_1 to 321_7 and first to seventh negative flip-flops 322_1 to 322_7. Operations of the first to seventh positive flip-flops 321_1 to 321_7 and the first to seventh negative flip-flops 322_1 to 322_7 may be similar to the operations of the first to seventh flip-flops 121_1 to 121_7

The first to seventh positive flip-flops 321_1 to 321_7 may sample the first to seventh delay signals DS[1:7] based on the positive data strobe signal PDQS and may output first to seventh rising sampling values RS[1:7]. The first to seventh negative flip-flops 322_1 to 322_7 may sample the first to seventh delay signals DS[1:7] based on the negative data strobe signal NDQS and may output first to seventh falling sampling values FS[1:7].

Figure 18:
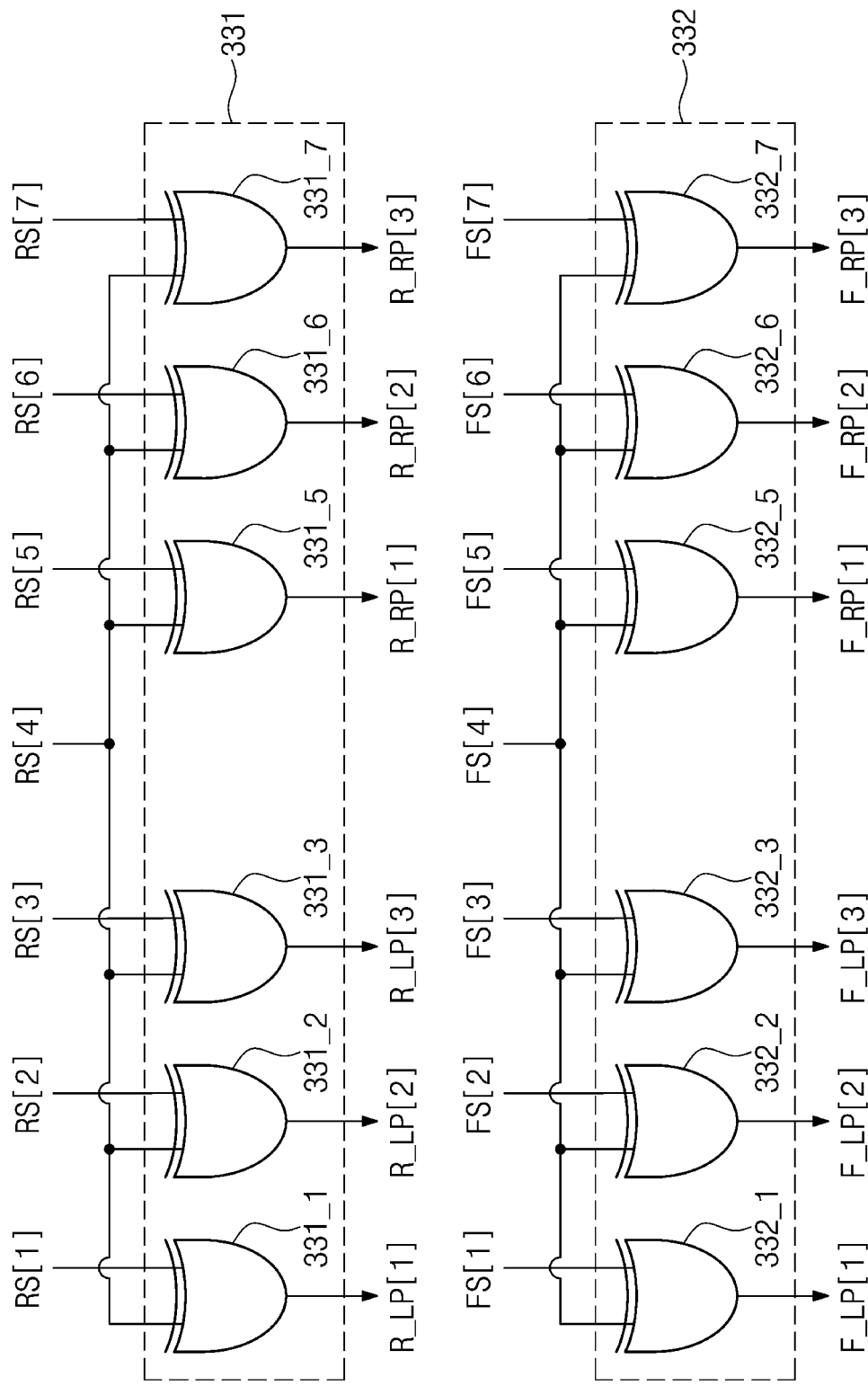
FIG. 18 is a block diagram illustrating a first comparator and a second comparator of the read margin control circuit of FIG. 16.

FIG. 18 is a block diagram illustrating a first comparator and a second comparator of the read margin control circuit of FIG. 16. FIG. 18 will be described with reference to FIGS. 6, 16, and 17.

The first comparator 331 may compare the fourth rising sampling value RS[4] with each of the first to third rising sampling values RS[1:3] and the fifth to seventh rising sampling values RS[5:7]. In some exemplary embodiments, the fourth rising sampling value RS[4] may be a value obtained by sampling a center delay signal (refer to the fourth delay signal DS[4] of FIG. 2) of delay signals at a rising edge of the data strobe signal DQS. The first comparator 331 may include first to third XOR gates 331_1 to 331_3 and fifth to seventh XOR gates 331_5 to 331_7. Operations of the first to third XOR gates 331_1 to 331_3 and fifth to seventh XOR gates 331_5 to 331_7 may be similar to the operations of the XOR gates 131_1 to 131_3 and 131_5 to 131_7 of FIG. 6.

The second comparator 332 may compare the fourth falling sampling value FS[4] with each of the first to third falling sampling values FS[1:3] and the fifth to seventh falling sampling values FS[5:7]. In some exemplary embodiments, the fourth falling sampling value FS[4] may be a value obtained by sampling a center delay signal (refer to the fourth delay signal DS[4] of FIG. 2) of delay signals at a falling edge of the data strobe signal DQS. The second comparator 332 may include first to third XOR gates 332_1 to 332_3 and fifth to seventh XOR gates 332_5 to 332_7. Operations of the first to third XOR gates 332_1 to 332_3 and fifth to seventh XOR gates 332_5 to 332_7 may be similar to the operations of the XOR gates 131_1 to 131_3 and 131_5 to 131_7 of FIG. 6.

Figure 19:
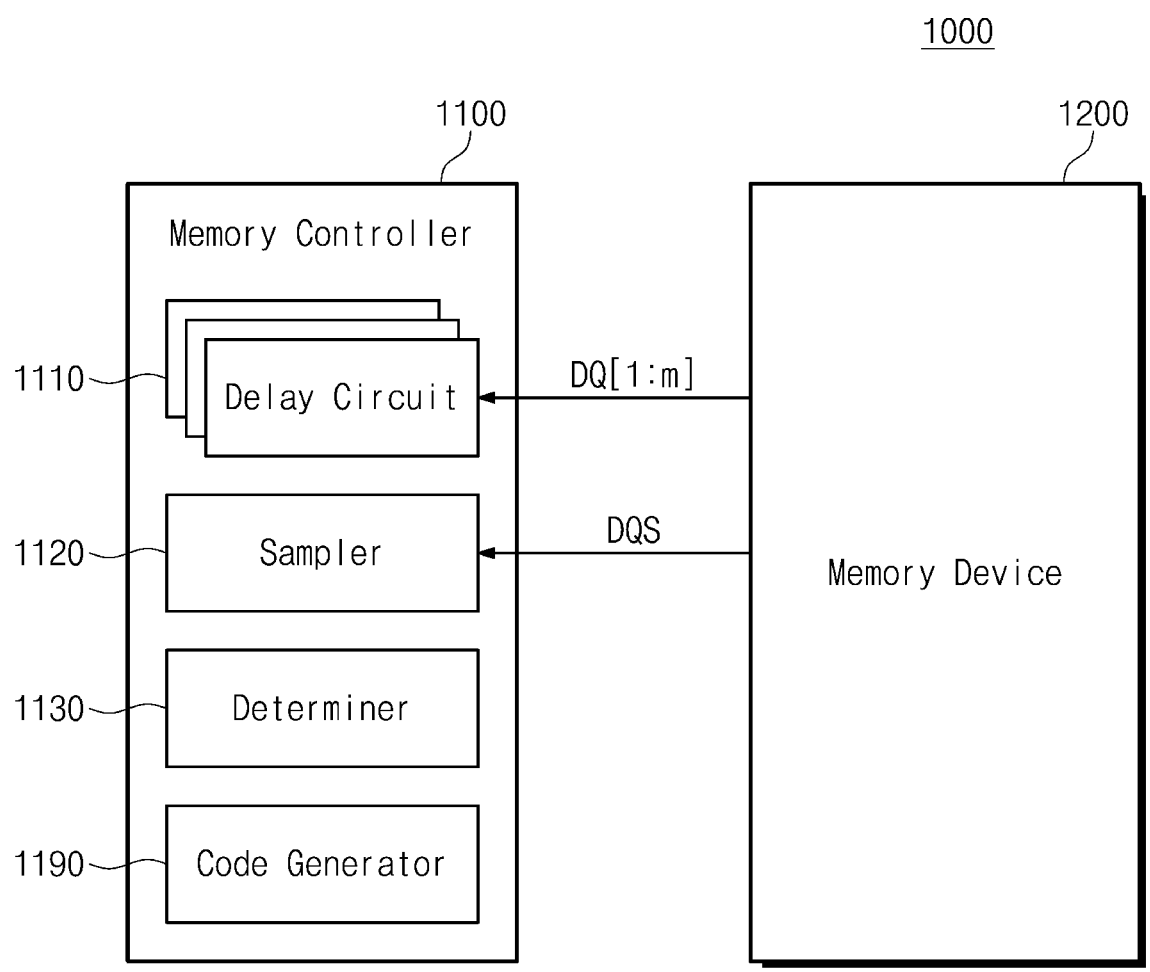
FIG. 19 is a block diagram illustrating a memory system according to an exemplary embodiment.

FIG. 19 is a block diagram illustrating a memory system according to an exemplary embodiment. A memory system 1000 may include a memory controller 1100 and a memory device 1200. The memory system 1000 may be implemented in an electronic device.

The memory controller 1100 may control the memory device 1200. The memory controller 1100 may transmit, to the memory device 1200, a write command for writing data to the memory device 1200 and a read command for reading data from the memory device 1200. The memory controller 1100 may operate to be similar to the read margin control circuit 100, 200, or 300 described with reference to FIGS. 1 to 18. As in the read margin control circuits 100, 200, and 300, the memory controller 1100 may include delay circuits 1110, a sampler 1120, and a determiner 1130, and/or a code generator 1190, depending on which of the read margin control circuits 100, 200, and 300 are implemented. Although not illustrated in FIG. 19, the memory controller 1100 may further include detailed components of the read margin control circuits 100, 200, and 300.

According to an exemplary embodiment, the memory controller 1100 may respectively determine data valid windows of data input/output signals DQ[1:m] and may respectively control read margins of the data input/output signals DQ[1:m]. Referring to FIG. 19, the number of the delay circuits 1110 may be the same as the number of the data input/output signals DQ[1:m]. The sampler 1120 may respectively sample delay signals of the delay circuits 1110 based on the data strobe signal DQS. Here, all the data input/output signals DQ[1:m] may be synchronized with the data strobe signal DQS.

The memory device 1200 may store data in response to the write command of the memory controller 1100 and may output data in response to the read command of the memory controller 1100. Referring to FIG. 19, the memory device 1200 may transmit the data input/output signals DQ[1:m] and the data strobe signal DQS to the memory controller 1100 in response to the read command of the memory controller 1100. Here, "m" that indicates the number of data input/output signals DQ[1:m] may be an integer of 1 or more, and may be determined depending on an interface defining a channel between the memory controller 1100 and the memory device 1200.

In some exemplary embodiments, the memory device 1200 may include a volatile memory device such as a dynamic random access memory (DRAM) device or a static random access memory (SRAM) device. In another embodiment, the memory device 1200 may include a nonvolatile memory device such as a NAND flash memory device, a NOR flash memory device, a resistive random access memory (RRAM) device, a ferroelectric random access memory (FRAM) device, a phase change random access memory (PRAM) device, a thyristor random access memory (TRAM) device, or a magnetic random access memory (MRAM) device.

Figure 20:
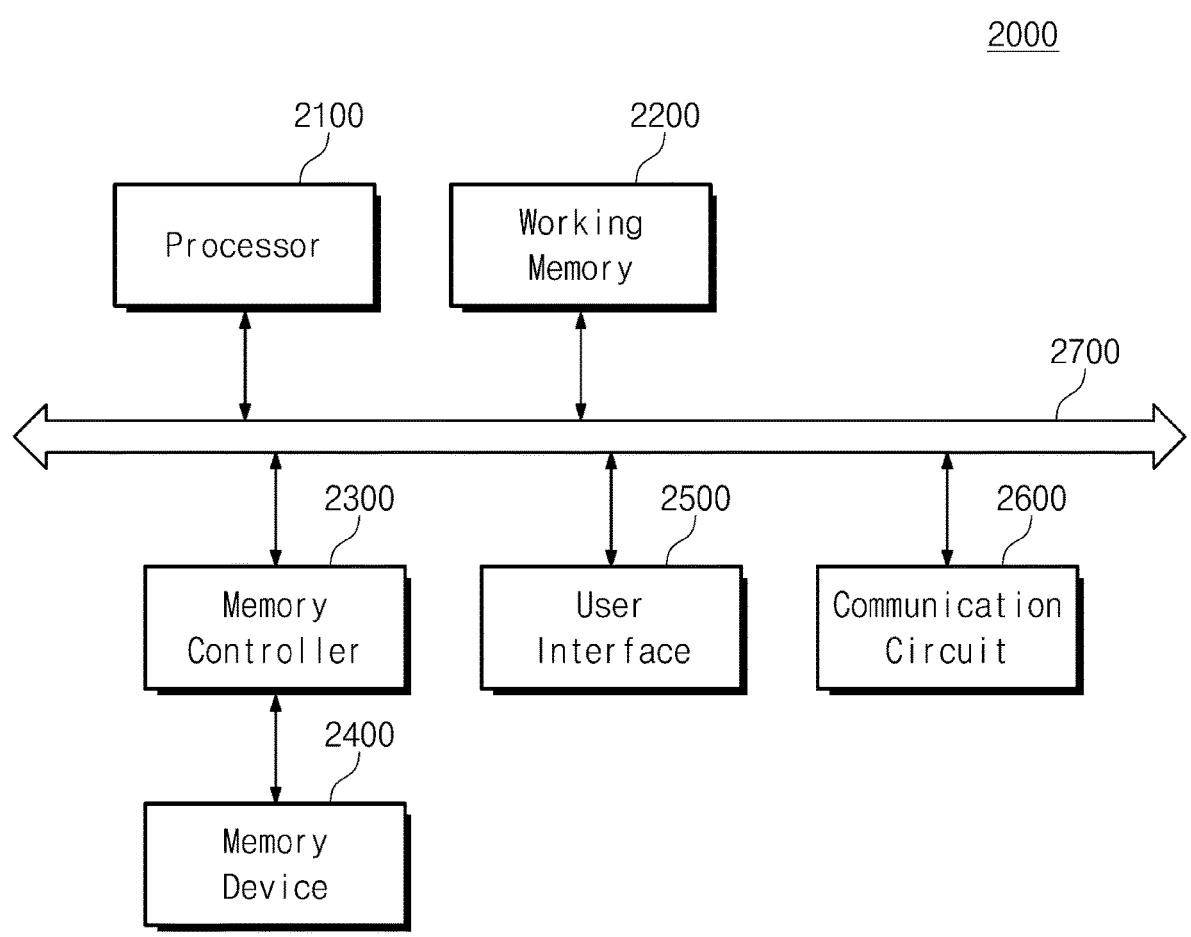
FIG. 20 is a block diagram illustrating a computing device according to an exemplary embodiment.

FIG. 20 is a block diagram illustrating a computing device according to an exemplary embodiment. Referring to FIG. 20, a computing device 2000 may include a processor 2100, a working memory 2200, a memory controller 2300, a memory device 2400, a user interface 2500, a communication circuit 2600, and a bus 2700.

The processor 2100 may control overall operations of the computing device 2000. The processor 2100 that may be a central processing unit (CPU) may perform various kinds of operations. For example, the processor 2100 may include one or more processor cores.

The working memory 2200 may exchange data with the processor 2100. The working memory 2200 may temporarily store data that are used for an operation of the computing device 2000. For example, the working memory 2200 may include a high-speed memory such as a DRAM or an SRAM.

The memory controller 2300 may exchange data with the memory device 2400. In some exemplary embodiments, operations of the memory controller 2300 and the memory device 2400 may be similar to the operations of the memory controller 1100 and the memory device 1200 described with reference to FIG. 19.

The user interface 2500 may perform communication mediation between a user and the computing device 2000 under control of the processor 2100. In some exemplary embodiments, the user interface 2500 may include input interfaces such as a keyboard, a keypad, a button, a touch panel, a touch screen, a touch pad, a touch ball, a camera, a microphone, a gyroscope sensor, and a vibration sensor. In addition, the user interface 2500 may include output interfaces such as a liquid crystal display (LCD) device, a light emitting diode (LED) display device, an organic LED (OLED) display device, an active matrix OLED (AMO-LED) display device, a speaker, and a motor.

The communication circuit 2600 may communicate with the outside of the computing device 2000 under control of the processor 2100. The communication circuit 2600 may communicate with the outside of the computing device 2000 in compliance with a wired communication protocol or a wireless communication protocol. For example, the communication circuit 2600 may communicate with the outside of the computing device 2000 in compliance with at least one of various wireless communication protocols, such as long term evolution (LTE), world interoperability for microwave access (WiMax), global system for mobile communications (GSM), code division multiple access (CDMA), Bluetooth, near field communication (NFC), wireless fidelity (Wi-Fi), and radio frequency identification (RFID) or at least one of various wired communication protocols, such as universal serial bus (USB), small computer system interface (SCSI), peripheral component interconnect express (PCIe), advanced technology attachment (ATA), parallel ATA (PATA), serial ATA (SATA), serial attached SCSI (SAS), integrated drive electronics (IDE), and universal flash storage (UFS).

The bus 2700 may provide a communication path between the components of the computing device 2000. The components of the computing device 2000 may exchange data with each other in compliance with a bus format. In some exemplary embodiments, the bus format may include universal serial bus (USB), small computer system interface (SCSI), peripheral component interconnect express (PCIe), advanced technology attachment (ATA), parallel ATA (PATA), serial ATA (SATA), and serial attached SCSI (SAS), and integrated drive electronics (IDE).

Figure 21:
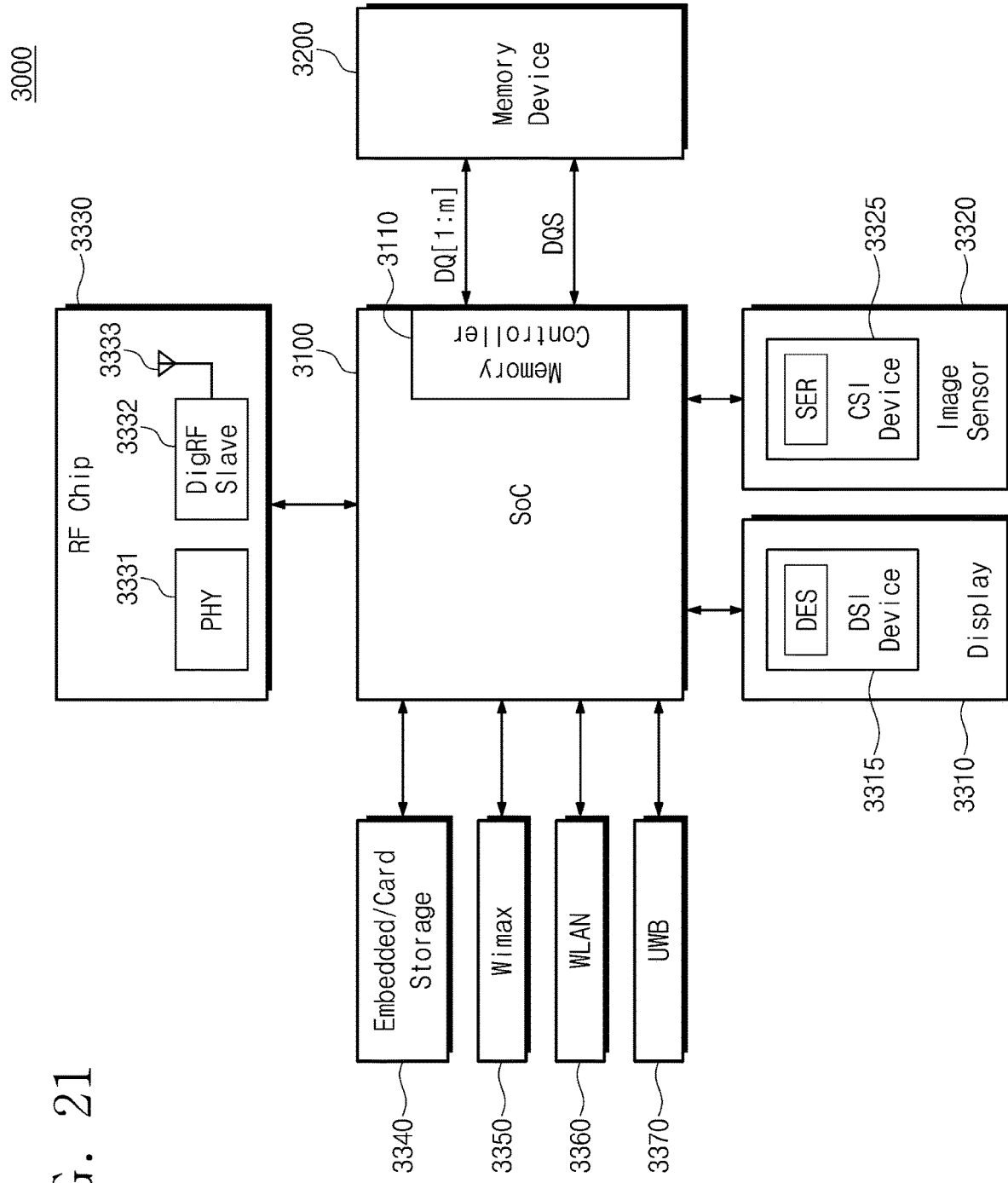
FIG. 21 is a block diagram illustrating an electronic device according to an exemplary embodiment.

FIG. 21 is a block diagram illustrating an electronic device according to an exemplary embodiment. An electronic device 3000 may be a data processing device that may use or support interfaces proposed by mobile industry processor interface (MIPI) alliance. The electronic device 3000 may be a portable communication terminal, a personal digital assistant (PDA), a portable multimedia player (PMP), a smartphone, or a wearable device.

The electronic device 3000 may include a system on chip (SoC) 3100 and a memory device 3200. The SoC 3100 that may be an application processor may control overall operations of the electronic device 3000. Various circuits for controlling the electronic device 3000 may be integrated in the SoC 3100. For example, the SoC 3100 may include a memory controller 3110.

In some exemplary embodiments, the memory controller 3110 and the memory device 3200 may exchange data with each other. The data input/output signals DQ[1:m] and the data strobe signal DQS may be transmitted between the memory controller 3110 and the memory device 3200 in both directions. Operations of the memory controller 3110 and the memory device 3200 may be similar to the operations of the memory controller 1100 and the memory device 1200 described with reference to FIG. 19.

The electronic device 3000 may include a display 3310 and an image sensor 3320. The SoC 3100 may communicate with a display serial interface (DSI) device 3315 of the display 3310 through a DSI. For example, an optical serializer SER may be implemented in the SoC 3100, and an optical deserializer DES may be implemented in the DSI device 3315.

The SoC 3100 may communicate with a camera serial interface (CSI) device 3325 of the image sensor 3320 through a CSI. For example, an optical deserializer DES may be implemented in the SoC 3100, and an optical serializer SER may be implemented in the CSI device 3325.

The electronic device 3000 may further include a radio frequency (RF) chip 3330 that communicates with the SoC 3100. The RF chip 3330 may include a physical layer 3331, a DigRF slave 3332, and an antenna 3333. For example, the physical layer 3331 of the RF chip 3330 and a physical layer of the SoC 3100 may exchange data with each other through a DigRF interface proposed by the MIPI alliance.

The electronic device 3000 may further include embedded/card storage 3340. The embedded/card storage 3340 may exchange data with the SoC 3100. In some exemplary embodiments, the SoC 3100 may receive data input/output signals and a data strobe signal output from the embedded/card storage 3340, may determine data valid windows of the data input/output signals, and may control read margins of the data input/output signals.

The electronic device 3000 may communicate with an external system through worldwide interoperability for microwave access (WiMAX) 3350, a wireless local area network (WLAN) 3360, ultra wide band (UWB) 3370, and the like. Also, the electronic device 3000 may further include a global positioning system (GPS) device for processing position information. The electronic device 3000 may further include a bridge chip for managing connection with peripheral devices.

A read margin control circuit according to an exemplary embodiment may avoid repeatedly sampling the data input/output signal DQ while changing the sampling point by applying an offset to the data strobe signal DQS and repeatedly issuing a read command. Accordingly, a time needed to determine the data valid window may decrease.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A read margin control circuit comprising:
   a delay circuit configured to receive a data input/output signal and generate a plurality of delay signals by delaying the data input/output signal, the plurality of delay signals having different phases from each other;
   a sampler configured to sample the plurality of delay signals of the data input/output signal based on a data strobe signal to generate a plurality of sampling values; and
   a determiner configured to determine a data valid window of the data input/output signal based on the plurality of sampling values.

2. The read margin control circuit of claim 1, wherein the delay circuit comprises a plurality of delay stages connected in series,
   wherein the plurality of delay signals are respectively output from the plurality of delay stages, and
   wherein a phase difference between the plurality of delay signals is determined based on a propagation delay of each of the plurality of delay stages.

3. The read margin control circuit of claim 1, wherein the plurality of delay signals comprise a first delay signal, a plurality of second delay signals which are less delayed than the first delay signal, and a plurality of third delay signals which are more delayed than the first delay signal, and
   wherein the plurality of sampling values comprise a first sampling value generated by sampling the first delay signal, a plurality of second sampling values generated by sampling the plurality of second delay signals, respectively, and a plurality of third sampling values generated by sampling the plurality of third delay signals, respectively.

4. The read margin control circuit of claim 3, wherein the determiner is further configured to compare the first sampling value with each of the plurality of second sampling values and compare the first sampling value with each of the plurality of third sampling values.

5. The read margin control circuit of claim 4, wherein the determiner comprises a plurality of logic gates, each logic gate performing an exclusive OR operation on the first sampling value, and one of the plurality of second sampling values or one of the plurality of third sampling values, or performing an exclusive NOR operation on the first sampling value, and one of the plurality of second sampling values or one of the plurality of third sampling values.

6. The read margin control circuit of claim 4, wherein the determiner is further configured to determine a size of the data valid window based on at least one sampling value matched with the first sampling value among the plurality of second sampling values and the plurality of third sampling values.

7. The read margin control circuit of claim 4, further comprising:
   a first delay cell configured to delay the data input/output signal; and
   a second delay cell configured to delay the data strobe signal,
   wherein the delay circuit is further configured to receive a first output of the first delay cell, and
   wherein the sampler is further configured to receive a second output of the second delay cell.

8. The read margin control circuit of claim 7, further comprising:
   a code generator configured to generate a code for adjusting a first delay amount of the first delay cell or a second delay amount of the second delay cell, based on the data valid window determined by the determiner.

9. The read margin control circuit of claim 8, wherein the code generator is further configured to generate the code based on at least one value not matched with the first sampling value among the plurality of second sampling values, such that the data input/output signal is more delayed with respect to the data strobe signal.

10. The read margin control circuit of claim 8, wherein the code generator is further configured to generate the code based on at least one value not matched with the first sampling value among the plurality of third sampling values, such that the data strobe signal is more delayed with respect to the data input/output signal.

11. A memory controller comprising:
    a delay circuit configured to receive a data input/output signal from a memory device to generate a first delay signal, a plurality of second delay signals which are less delayed than the first delay signal, and a plurality of third delay signals which are more delayed than the first delay signal, by delaying the data input/output signal;
    a sampler configured to sample the first delay signal, the plurality of second delay signals, and the plurality of third delay signals at a rising edge of a data strobe signal transmitted from the memory device and to sample the first delay signal, the plurality of second delay signals, and the plurality of third delay signals at a falling edge of the data strobe signal; and
    a determiner configured to determine a data valid window of the data input/output signal based on a first rising sampling value and a first falling sampling value of the first delay signal, which are respectively sampled at the rising edge and the falling edge.

12. The memory controller of claim 11, wherein the delay circuit comprises a plurality of delay stages configured to delay the data input/output signal, and
    wherein the first delay signal, the plurality of second delay signals, and the plurality of third delay signals are respectively output from the plurality of delay stages.

13. The memory controller of claim 12, wherein the determiner is further configured to compare the first rising sampling value with each of a plurality of second rising sampling values and a plurality of third rising sampling values of the plurality of second delay signals and the plurality of third delay signals sampled at the rising edge, and to compare the first falling sampling value with each of a plurality of second falling sampling values and a plurality of third falling sampling values of the plurality of second delay signals and the plurality of third delay signals sampled at the falling edge.

14. The memory controller of claim 13, further comprising:
    a first delay cell configured to delay the data input/output signal; and
    a second delay cell configured to delay the data strobe signal,
    wherein the delay circuit is configured to receive a first output of the first delay cell, and
    wherein the sampler is configured to receive a second output of the second delay cell.

15. The memory controller of claim 14, further comprising:
    a code generator configured to generate a code for adjusting a first delay amount of the first delay cell or a second delay amount of the second delay cell, based on at least one first value not matched with the first rising sampling value among the plurality of second rising sampling values and the plurality of third rising sampling values, or at least one second value not matched with the first falling sampling value among the plurality of second falling sampling values and the plurality of third falling sampling values.

16. The memory controller of claim 15, wherein a unit of the first delay amount of the first delay cell or the second delay amount of the second delay cell, which is adjusted according to the code, corresponds to a propagation delay of each of the plurality of delay stages.

17. An electronic device comprising:
    a memory device configured to generate a data input/output signal and a data strobe signal synchronized with the data input/output signal; and
    a memory controller configured to generate a plurality of delay signals having different phases by delaying the data input/output signal, to generate a plurality of sampling values by sampling the plurality of delay signals of the data input/output signal based on the data strobe signal, and to determine a data valid window of the data input/output signal based on the plurality of sampling values.

18. The electronic device of claim 17, wherein the memory controller is further configured to compare a first sampling value of the plurality of sampling values with a plurality of second sampling values and a plurality of third sampling values of the plurality of sampling values except for the first sampling value.

19. The electronic device of claim 18, wherein the first sampling value is generated by sampling a first delay signal of the plurality of delay signals,
    wherein the plurality of second sampling values are generated by sampling a plurality of second delay signals of the plurality of delay signals,
    wherein the plurality of third sampling values are generated by sampling a plurality of third delay signals of the plurality of delay signals, and
    wherein the first delay signal is more delayed than the plurality of second delay signals and is less delayed than the plurality of third delay signals.

20. The electronic device of claim 17, wherein the memory controller is further configured to adjust a first delay of the data input/output signal or a second delay of the data strobe signal based on the data valid window that is determined.

* * * * *